United States Patent
Miyaguchi et al.

(10) Patent No.: US 8,044,407 B2
(45) Date of Patent: *Oct. 25, 2011

(54) LIQUID CRYSTAL DISPLAY DEVICE AND ELECTRONIC DEVICE PROVIDED WITH THE SAME

(75) Inventors: Atsushi Miyaguchi, Atsugi (JP); Satohiro Okamoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/608,266

(22) Filed: Oct. 29, 2009

(65) Prior Publication Data

US 2010/0044713 A1    Feb. 25, 2010

Related U.S. Application Data

(63) Continuation of application No. 12/219,014, filed on Jul. 15, 2008, now Pat. No. 7,633,089.

(30) Foreign Application Priority Data

Jul. 26, 2007    (JP) ................................. 2007-194844

(51) Int. Cl.
    *H01L 27/14*    (2006.01)
(52) U.S. Cl. ............ 257/72; 257/59; 257/258; 257/347; 257/E51.005
(58) Field of Classification Search .................... 257/59, 257/72, 258, 347, E51.005
    See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,591,987 A | 1/1997 | Yamazaki et al. |
| 5,701,167 A | 12/1997 | Yamazaki |
| 5,849,601 A | 12/1998 | Yamazaki |

(Continued)

FOREIGN PATENT DOCUMENTS

JP    04-242724    8/1992

(Continued)

OTHER PUBLICATIONS

Sazonov et al., "Low-Temperature Materials and Thin Film Transistors for Flexible Electronics" Proceedings of the IEEE, Aug. 2005, vol. 93, No. 8, pp. 1420-1428.

(Continued)

*Primary Examiner* — Tan N Tran
(74) *Attorney, Agent, or Firm* — Eric J. Robinson; Robinson Intellectual Property Law Office, P.C.

(57) ABSTRACT

A liquid crystal display device provided with a thin film transistor with excellent electrical characteristics and reduced off current, for which increase in manufacturing costs can be suppressed while suppressing reduction in yield. A thin film transistor includes a gate electrode provided over a substrate; a gate insulating film provided to cover the substrate and the gate electrode; a first island-shaped semiconductor layer and a second island-shaped semiconductor layer each formed as a stack of a microcrystalline semiconductor layer and a buffer layer with a depression on an upper surface thereof, over the gate electrode with the gate insulating film interposed therebetween; a conductive semiconductor layer; and a conductive layer provided on the conductive semiconductor layer. The conductive semiconductor layer is provided between the first island-shaped semiconductor layer and the second island-shaped semiconductor layer in contact with the gate insulating film.

35 Claims, 27 Drawing Sheets

U.S. PATENT DOCUMENTS

| | | | |
|---|---|---|---|
| 6,023,075 | A | 2/2000 | Yamazaki |
| 6,252,249 | B1 | 6/2001 | Yamazaki |
| 6,306,213 | B1 | 10/2001 | Yamazaki |
| 6,933,568 | B2 | 8/2005 | Yang et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,576,360 | B2 | 8/2009 | Yamazaki |
| 7,633,089 | B2 * | 12/2009 | Miyaguchi et al. .............. 257/59 |
| 7,648,861 | B2 | 1/2010 | Yamazaki et al. |
| 7,674,650 | B2 | 3/2010 | Akimoto et al. |
| 2005/0012097 | A1 | 1/2005 | Yamazaki |
| 2007/0108446 | A1 | 5/2007 | Akimoto |

FOREIGN PATENT DOCUMENTS

| | | |
|---|---|---|
| JP | 09-092841 | 4/1997 |
| JP | 11-121761 | 4/1999 |
| JP | 2005-049832 | 2/2005 |
| JP | 2005-167051 | 6/2005 |

OTHER PUBLICATIONS

Lee et al., "Top-Gate TFTs Using 13.56 MHz PECVD Microcrystalline Silicon" IEEE Electron Device Letters, Sep. 5, 2005, vol. 26, No. 9, pp. 637-639.

Lee et al., "Postdeposition Thermal Annealing and Material Stability of 75° C Hydrogenated Nanocrystalline Silicon Plasma-Enhanced Chemical Vapor Deposition Films" Journal of Applied Physics, Aug. 4, 2005, vol. 98, pp. 034305-1-034305-7.

Esmaeili-Rad et al., "Stability of Nanocrystalline Silicon Bottom-Gate Thin Film Transistors with Silicon Nitride Gate Dielectric" Journal of Applied Physics, Sep. 28, 2007, vol. 102, pp. 064512-1-064512-7.

Esmaeili-Rad et al., "Absence of Defect State Creation in Nanocrystalline Silicon Thin Film Transistors Deduced from Constant Current Stress Measurements" Applied Physics Letters, Sep. 12, 2007, vol. 91, pp. 113511-1-113511-3.

Lee et al., "Leakage Current Mechanisms in Top-Gate Nanocrystalline Silicon Thin Film Transistors" Applied Physics Letters, Feb. 28, 2008, vol. 92, pp. 083509-1-083509-3.

Lee et al., "Stability of nc-Si:H TFTs With Silicon Nitride Gate Dielectric" IEEE Transactions on Electron Devices, Jan. 2007, vol. 54, No. 1, pp. 45-51.

Lee et al., "Directly Deposited Nanocrystalline Silicon Thin-Film Transistors With Ultra High Mobilities" Applied Physics Letters, Dec. 18, 2006, vol. 89, pp. 252101-1-252101-3.

Lee et al., "How to Achieve High Mobility Thin Film Transistors by Direct Deposition of Silicon Using 13.56 MHz RF PECVD?" IEDM 2006, pp. 295-298.

Arai et al., "41.2: Micro Silicon Technology for Active Matrix OLED Display," SID '07 Digest, vol. XXXVIII, May 23-25, 2007, pp. 1370-1373.

Lee.C et al., "High-Mobility Nanocrystalline Silicon Thin-Film Transistors Fabricated by Plasma-Enhanced Chemical Vapor Deposition", Appl. Phys. Lett. (Applied Physics Letters) , May 24, 2005, vol. 86, pp. 222106-1-222106-3.

Lee.C et al., "High-Mobility N-Channel and P-Channel Nanocrystalline Silicon Thin-Film Transistors", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays", IEDM 06: Technical Digest of International Electron Devices Meeting, 2006, pp. 303-306.

* cited by examiner

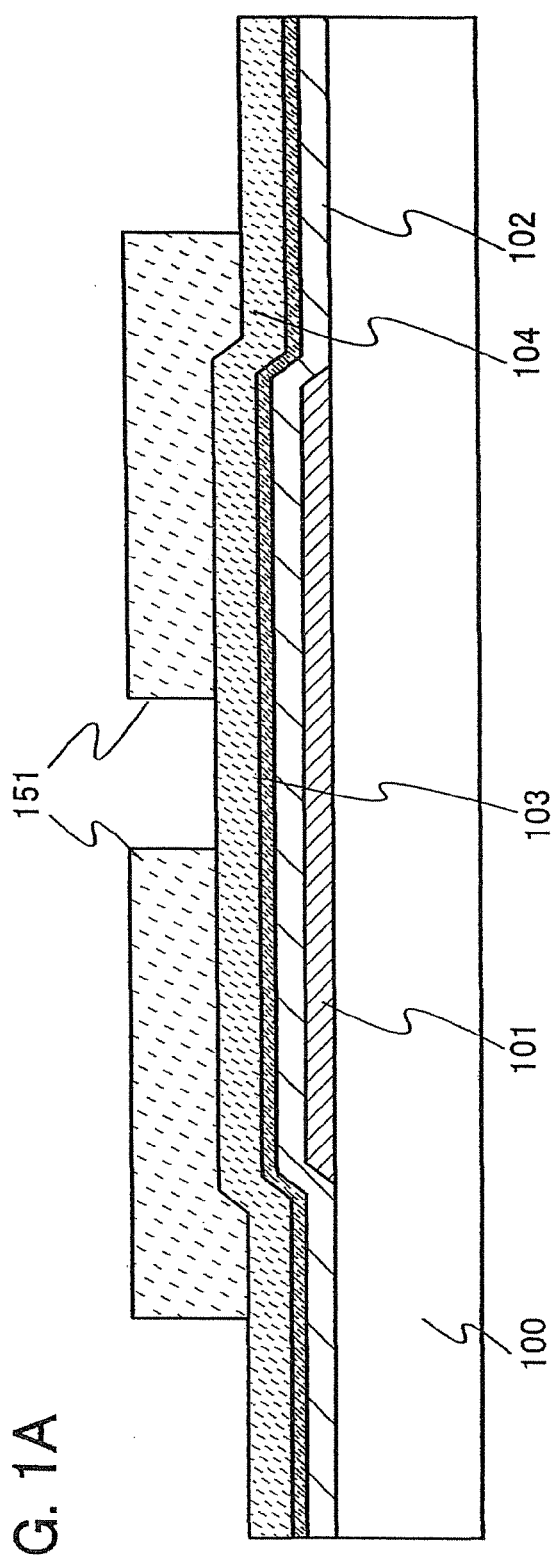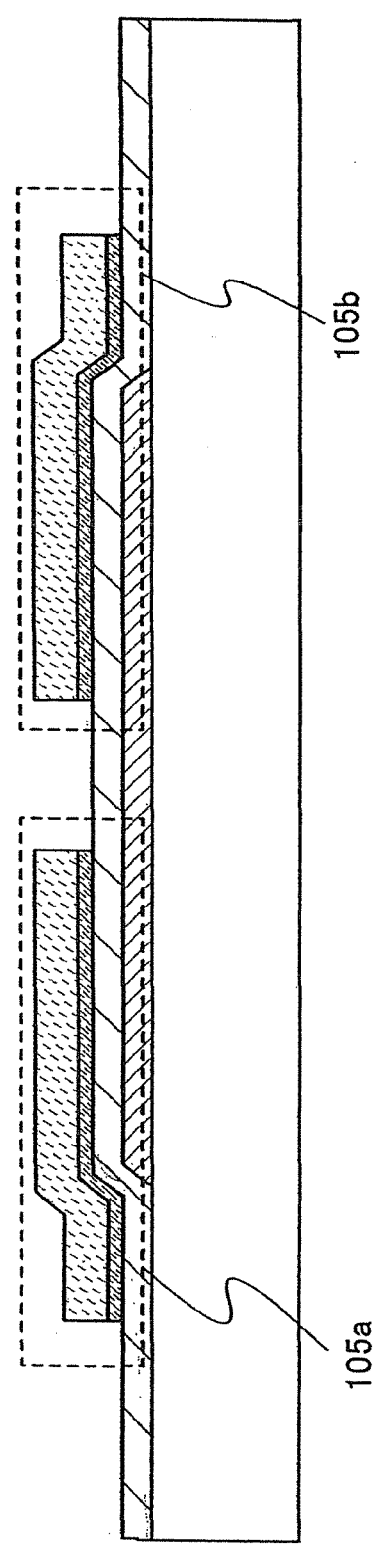

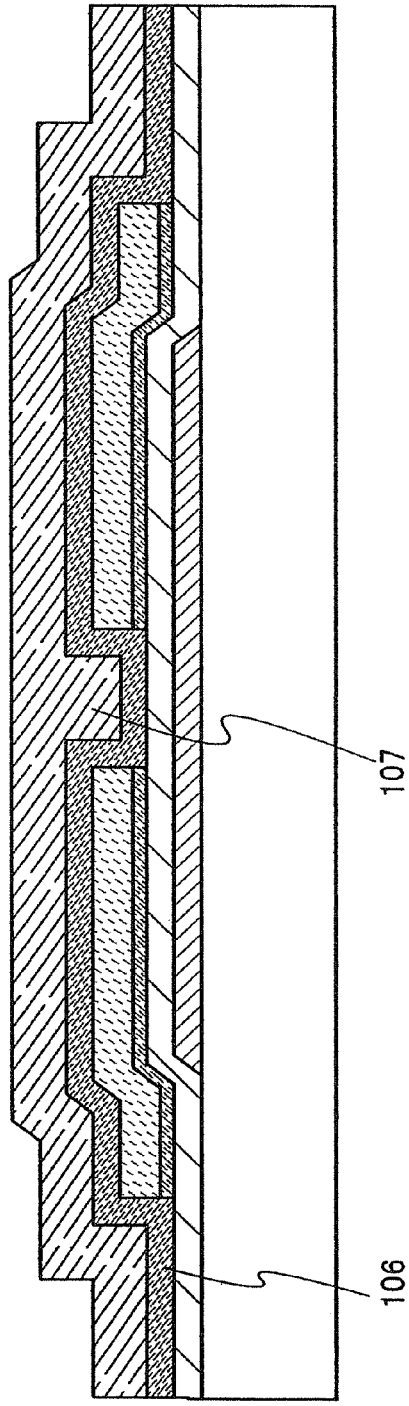

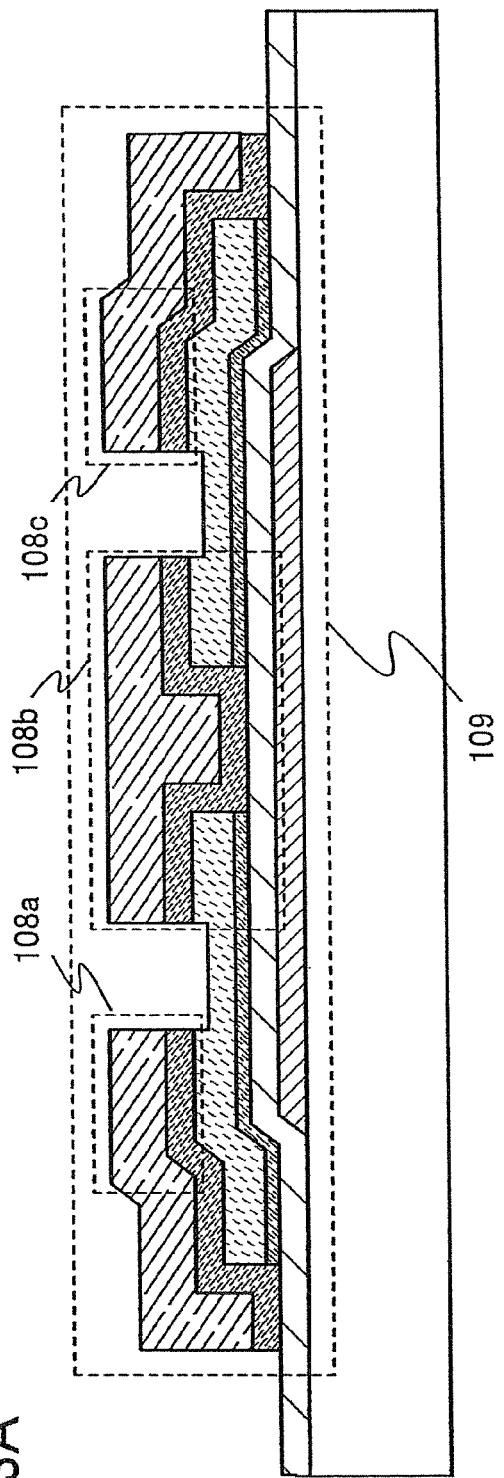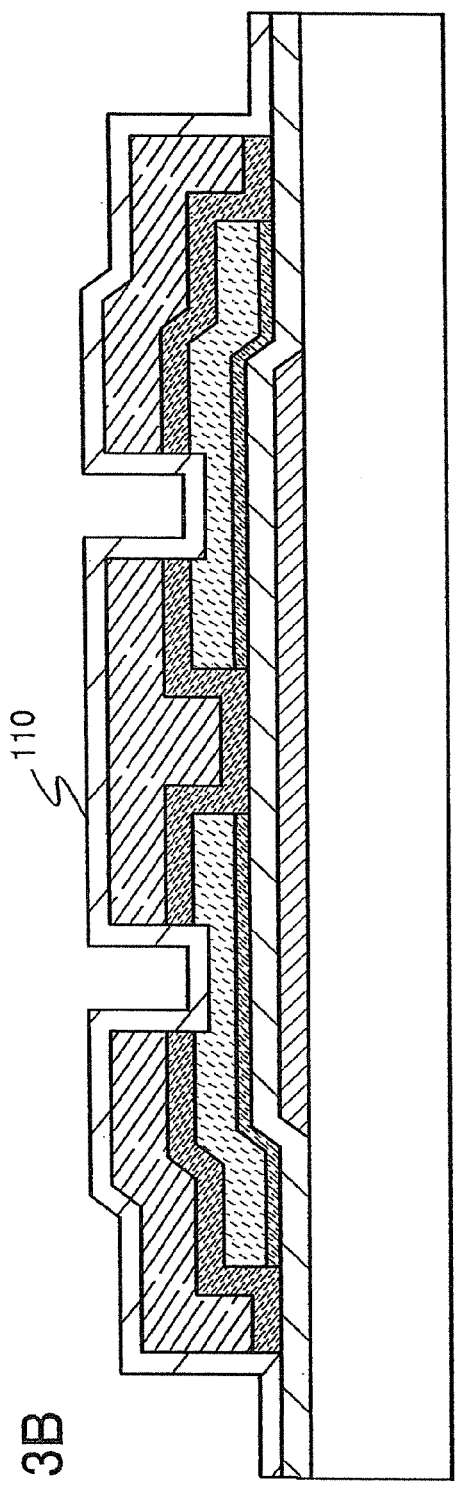

LIQUID CRYSTAL DISPLAY DEVICE AND ELECTRONIC DEVICE PROVIDED WITH THE SAME

BACKGROUND OF THE INVENTION

1. Field of the Invention

The present invention relates to a liquid crystal display device and an electronic device using the liquid crystal display device. The present invention particularly related to a liquid crystal display device using a thin film transistor in a pixel portion, and an electronic device using the liquid crystal display device.

2. Description of the Related Art

In recent years, techniques to form thin film transistors using a semiconductor thin film (with a thickness of approximately several nanometers to several hundreds of nanometers) which is formed over a substrate having an insulating surface have been put to practical use in many electronic devices. Thin film transistors are put to practical use particularly as switching elements in pixel portions of liquid crystal display devices, and research and development is still actively pursued.

As a switching element of a liquid crystal display device, a thin film transistor using an amorphous semiconductor film is used for large panels, and a thin film transistor using a polycrystalline semiconductor film is used for small panels. As a method of forming a polycrystalline semiconductor film, there is known a technique in which a pulsed excimer laser beam is shaped into a linear laser beam by an optical system and an amorphous silicon film is crystallized by being irradiated while being scanned with the linear laser beam.

Further, as a switching element of an image display device, a thin film transistor using a microcrystalline semiconductor film is used (see Patent Document 1: Japanese Published Patent Application No. 4-242724, Patent Document 2: Japanese Published Patent Application No. 2005-49832, and Patent Document 3: U.S. Pat. No. 5,591,987). In addition, as a manufacturing method of a thin film transistor with a purpose of improving characteristics of an amorphous semiconductor film, a method of forming an amorphous silicon film over a gate insulating film, forming a metal film over a top surface thereof, and then irradiating the metal film with a diode laser to modify the amorphous silicon film into a microcrystalline silicon film, is known (see Non Patent Document 1: Toshiaki Arai and others, SID '07 DIGEST, 2007, p. 1370-1373). According to this method, the metal film formed over the amorphous silicon film is provided for converting the light energy of the diode laser into thermal energy, and should be removed afterwards to complete a thin film transistor. In other words, it is a method in which the amorphous silicon film is heated only by conduction heating from the metal film, so that a microcrystalline silicon film, which is a microcrystalline semiconductor film, is formed.

SUMMARY OF THE INVENTION

A thin film transistor using a polycrystalline semiconductor film has advantages in that its mobility is two or more orders of magnitude greater than that of a thin film transistor using an amorphous semiconductor film, and a pixel portion of a liquid crystal display device and peripheral driver circuits thereof can be formed over the same substrate. However, the process of the thin film transistor using a polycrystalline semiconductor film is more complex than that of a thin film transistor using an amorphous semiconductor film, because of a step of crystallizing the polycrystalline semiconductor film; accordingly, there are problems in that yield is decreased and cost is increased.

There is also a problem in that a surface of a microcrystalline semiconductor film is easily oxidized. Therefore, when microcrystal grains in a channel formation region are oxidized, an oxide film is formed on surfaces of the microcrystal grains and the oxide film becomes an obstacle to carrier transfer, which causes a problem in that electric characteristics of a thin film transistor are impaired.

In terms of easiness of manufacturing, a thin film transistor with an inversely staggered structure is hopeful as a switching element provided for a pixel portion of a liquid crystal display device. In terms of improvement in the aperture ratio of a pixel, improvement in performance and reduction in size of inversely staggered thin film transistors are desired; however, there is a problem of increase in leakage currents (also called "off currents") that flow between source and drain regions when the thin film transistor is turned off. Accordingly, there are problems of difficulty in reducing the size of the thin film transistor as well as reducing the size of the storage capacitor and its power consumption.

In view of the above problems, an object of the present invention is to suggest a liquid crystal display device for which increase in manufacturing costs can be suppressed while suppressing reduction in yield, which is also provided with a thin film transistor with excellent electrical characteristics and reduced off current.

A thin film transistor included in a liquid crystal display device of the present invention includes a gate electrode provided over a substrate; a gate insulating film provided to cover the substrate and the gate electrode; a first island-shaped semiconductor layer and a second island-shaped semiconductor layer each provided as a stack of a microcrystalline semiconductor layer and a buffer layer with a depression on an upper surface thereof, over the gate electrode with the gate insulating film interposed therebetween; a conductive semiconductor layer provided over the buffer layer; and a conductive layer provided in contact with the conductive semiconductor layer, the conductive semiconductor layer is not provided over the depression, and the conductive semiconductor layer is provided between the first island-shaped semiconductor layer and the second island-shaped semiconductor layer to be in contact with the gate insulating film.

Note that a liquid crystal display device includes a liquid crystal element. Further, a liquid crystal display device includes a panel in which a liquid crystal element is sealed, and a module in which an IC or the like including a controller is mounted to the panel. Moreover, the present invention relates to an element substrate which is a mode before completion of a liquid crystal element in a manufacturing process of the liquid crystal display device, and the element substrate includes a means for supplying voltage to a liquid crystal element in each of plural pixels. The element substrate may be specifically in a state where only a pixel electrode of a liquid crystal element is formed or in a state after a conductive film to be a pixel electrode is formed and before the conductive film is etched into a pixel electrode, and any mode is possible.

Note that the term "liquid crystal display device" in this specification refer to image display devices, liquid crystal display devices, and light sources (including lighting devices). In addition, liquid crystal display devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a liquid crystal element by a chip-on-glass (COG) method.

According to the present invention, it is possible to provide a liquid crystal display device provided with a thin film transistor with good electrical characteristics and reduced off current, while suppressing reduction in yield as well as increase in manufacturing costs.

BRIEF DESCRIPTION OF DRAWINGS

In the following drawings:

FIGS. 1A and 1B are cross-sectional views showing a manufacturing method of a liquid crystal display device of the present invention;

FIGS. 2A and 2B are cross-sectional views showing a manufacturing method of a liquid crystal display device of the present invention;

FIGS. 3A and 3B are cross-sectional views showing a manufacturing method of a liquid crystal device of the present invention;

DETAILED DESCRIPTION OF THE INVENTION

Embodiment Mode

Figure 4A:
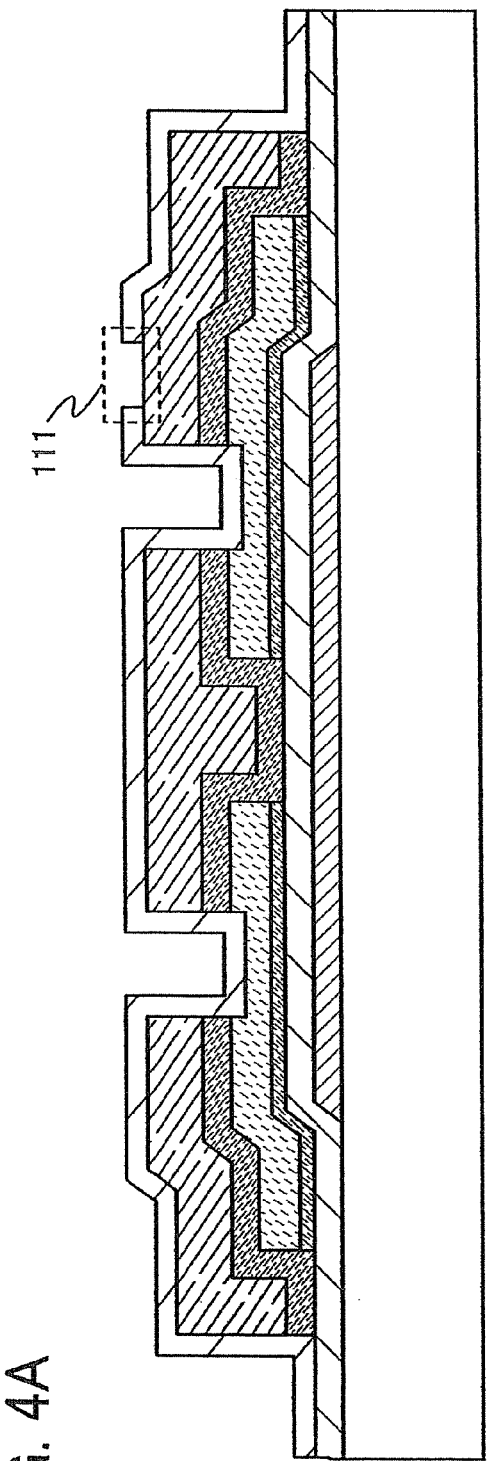
FIGS. 4A and 4B are cross-sectional views showing a manufacturing method of a liquid crystal display device of the present invention.

Embodiment modes of the present invention will be hereinafter described with reference to the drawings. However, the present invention can be carried out in many different modes, and it is easily understood by those skilled in the art that the mode and detail of the present invention can be modified in various ways without departing from the spirit and scope thereof. Therefore, the present invention should not be interpreted as being limited to the description in the following embodiment modes.

Embodiment Mode 1

In this embodiment mode, manufacturing steps of a multi-channel thin film transistor (hereinafter referred to as a "multi-channel TFT") used in a liquid crystal display device is described with reference to drawings. FIGS. 1A and 1B, FIGS. 2A and 2B, FIGS. 3A and 3B, and FIGS. 4A and 4B are cross-sectional views illustrating manufacturing steps of a multi-channel TFT, and FIGS. 5A to 5C, FIGS. 6A and 6B, FIGS. 7A and 7B, FIGS. 8A and 8B, and FIGS. 9A and 9B are top views of connection regions of the multi-channel TFT and a pixel electrode in one pixel. Note that in this specification, "multi-channel" refers to a configuration in which a plurality of channel regions are electrically connected in series between source and drain regions of a transistor, and a multi-channel transistor is also referred to as a "multi-channel thin film transistor."

An n-channel multi-channel TFT having a microcrystalline semiconductor film is more suitable for use in a driver circuit than a p-channel multi-channel TFT having a microcrystalline semiconductor film, because the n-channel one has a higher mobility. It is desired that all multi-channel TFTs formed over the same substrate have the same polarity in order to reduce the number of steps. Here, description is made using an n-channel multi-channel TFT.

As illustrated in FIG. 1A, a gate electrode is formed over a substrate 100. As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless alloy and the like with the surface provided with an insulating film may be employed. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 101 is formed using a metal material such as titanium, molybdenum, chromium, tantalum, tungsten, or aluminum, or an alloy material thereof. The gate electrode 101 can be formed in such a manner that a conductive film is formed over the substrate 100 by a sputtering method or a vacuum evaporation method; a mask is formed over the conductive film by a photolithography technique or an inkjet method; and the conductive film is etched using the mask. Note that, as a barrier metal which increases adhesion of the gate electrode 101, a nitride film of the above-mentioned metal material may be provided between the substrate 100 and the gate electrode 101. For example, a stacked-layer structure of aluminum and molybdenum, a stacked-layer structure of copper and molybdenum, or a stacked-layer structure of copper and titanium nitride or tantalum nitride is provided. In this embodiment mode, the gate electrode 101 is formed by etching of the conductive film formed over the substrate 100 with use of a resist mask formed using a first photomask.

Note that, because a semiconductor film and a wiring are to be formed over the gate electrode 101, it is desired that the gate electrode 101 be processed to have tapered end portions in order to prevent disconnection. In addition, although not shown, in this step, a wiring connected to the gate electrode can also be formed at the same time.

Next, over the gate electrode 101, a gate insulating film 102, a microcrystalline semiconductor film 103, and a buffer layer 104 are formed in this order. Then, a resist 151 is applied over the buffer layer 104. Note that it is preferable that the gate insulating film 102, the microcrystalline semiconductor film 103, and the buffer layer 104 be formed successively. By successive formation of the gate insulating film 102, the microcrystalline semiconductor film 103, and the buffer layer 104 without exposure to the atmosphere, each interface between stacked layers can be formed without being contaminated by an atmospheric constituent or a contaminant impurity element floating in the atmosphere. Thus, variations in characteristics of thin film transistors can be reduced.

The gate insulating film 102 can be formed by a CVD method, a sputtering method, or the like using a silicon oxide film, a silicon nitride film, a silicon oxynitride film, or a silicon nitride oxide film. Note that as the gate insulating film 102, a stack of two layers, a silicon oxide film or a silicon oxynitride film and a silicon nitride film or a silicon nitride oxide film, can be formed instead of having a single layer of a gate insulating film. Note that the gate insulating film can be formed by stacking not two layers but three layers of a silicon nitride film or a silicon nitride oxide film, a silicon oxide film or a silicon oxynitride film, and a silicon nitride film or a silicon nitride oxide film in this order from the substrate side.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 103 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with its grains with a size of 0.5 nm to 20 nm grown in the direction of a normal line with respect to the surface of the substrate. In addition, a microcrystalline semiconductor and a non-single crystalline semiconductor are mixed. Microcrystalline silicon, which is a typical example of a microcrystalline semiconductor, has a Raman spectrum which is shifted to a lower wave number side than 521 cm$^{-1}$ that is a feature of single crystalline silicon. That is, the peak of a Raman spectrum of microcrystalline silicon exists between 481 cm$^{-1}$ and 521 cm$^{-1}$, which are features of amorphous silicon and single crystalline silicon respectively. In addition, microcrystalline silicon is made to contain hydrogen or halogen of at least 1 at. % or more for termination of dangling bonds. Moreover, microcrystalline silicon is made to contain a rare gas element such as helium, argon, krypton, or neon to further enhance its lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens of megahertz to several hundred megahertz or a microwave plasma CVD) apparatus with a frequency of 1 GHz or more. The microcrystalline semiconductor film can be typically formed using silicon hydride, such as $SiH_4$ or $Si_2H_6$ that is diluted with hydrogen. Alternatively, by dilution with one or plural kinds of rare gas elements of helium, argon, krypton, and neon in addition to silicon hydride and hydrogen, the microcrystalline semiconductor film can be formed. In that case, the flow rate ratio of hydrogen to silicon hydride is set to be 50:1 to 1000:1, preferably, 50:1 to 200:1, more preferably, 100:1. Note that, in place of silicon hydride, $SiH_2Cl_2$, $SiHCl_3$, $SiCl_4$, $SiF_4$, or the like can be used.

A microcrystalline semiconductor film exhibits weak n-type conductivity when an impurity element for valence control is not intentionally added. Thus, threshold control of a microcrystalline semiconductor film which functions as a channel formation region of a multi-channel TFT can be done by addition of an impurity element which imparts p-type conductivity at the same time as or after the film formation. A typical example of an impurity element which imparts p-type conductivity is boron, and an impurity gas such as $B_2H_6$ or $BF_3$ may be mixed into silicon hydride at a proportion of 1 ppm to 1000 ppm, preferably, 1 ppm to 100 ppm. The concentration of boron may be set to be, for example, $1 \times 10^{14}$ atoms/cm$^3$ to $6 \times 10^{16}$ atoms/cm$^3$.

In addition, the oxygen concentration of the microcrystalline semiconductor film is preferably $5 \times 10^{19}$ atoms/cm$^3$ or less, more preferably, $1 \times 10^{19}$ atoms/cm$^3$ or less and each of the nitrogen concentration and the carbon concentration is preferably $3 \times 10^{18}$ atoms/cm$^3$ or less. By decreases in concentrations of oxygen, nitrogen, and carbon mixed into the microcrystalline semiconductor film, the microcrystalline semiconductor film can be prevented from becoming an n type.

The microcrystalline semiconductor film 103 is formed to a thickness of less than or equal to 200 nm, preferably, from 1 nm to 100 nm, more preferably, from 5 nm to 50 nm. The microcrystalline semiconductor film 103 functions as a channel formation region of a multi-channel TFT to be formed later. When the thickness of the microcrystalline semiconductor film 103 is within the range from 5 nm to 50 nm, the multi-channel TFT to be formed later becomes a fully depleted type. In addition, because the deposition rate of the microcrystalline semiconductor film 103 is low, i.e., a tenth to a hundredth of the deposition rate of an amorphous semiconductor film, a decrease of thickness leads to an increase of throughput. Furthermore, because the microcrystalline semiconductor film contains microcrystals, it has a lower resistance than an amorphous semiconductor film. Therefore, a multi-channel TFT using the microcrystalline semiconductor film for its channel formation region has current-voltage characteristics represented by a curve with a steep slope in a rising portion, has an excellent response as a switching element, and can be operated at high speed. With the use of the microcrystalline semiconductor film in a channel formation region of a multi-channel TFT, fluctuation of a threshold voltage of a multi-channel TFT can be suppressed. Therefore, a liquid crystal display device with less variation of electrical characteristics can be manufactured.

The microcrystalline semiconductor film has a higher mobility than an amorphous semiconductor film. Thus, by using for a switching element of a liquid crystal element a multi-channel TFT in which a channel formation region is formed of the microcrystalline semiconductor film, the area of the channel formation region, that is, the area of the multi-channel TFT, can be decreased. Accordingly, the area occupied by the multi-channel TFT in a single pixel is decreased, and an aperture ratio of the pixel can be increased.

Further, with a purpose of improving electrical characteristics of the microcrystalline semiconductor film, laser beam irradiation may be performed on a surface of the microcrystalline semiconductor film over the gate insulating film. The laser beam is emitted at an energy density that does not melt the crystalline semiconductor film. In other words, laser treatment of the crystalline semiconductor film is solid-phase crystal growth performed by radiation heating without melting the crystalline semiconductor film. That is, the laser treatment utilizes a critical region where the accumulated crystalline semiconductor film does not go into a liquid phase, and in that sense, the laser treatment may be called "critical growth" as well.

The laser beam can be effective to an interface between the microcrystalline semiconductor film and the gate insulating film. Accordingly, with crystals on a surface of the microcrystalline semiconductor film as seeds, basically columnar crystals grow by progression of solid-phase crystal growth from the surface towards the interface with the gate insulating film. The solid-phase crystal growth by laser treatment does not enlarge the crystal grain diameter, but rather improves crystallinity in a thickness direction of the film. In the laser treatment, by focusing the laser beam in a long rectangular shape (linear laser beam), a microcrystalline semiconductor film over a 730 mm×920 mm glass substrate for example, can be treated by scanning the laser beam once. In this case, the overlap ratio of the linear laser beam is to be 0% to 90% (preferably 0% to 67%). Accordingly, processing time per one substrate can be reduced to improve productivity. The shape of the laser beam is not limited to a linear shape, and a similar treatment can be performed with a planar shape laser beam. Further, the present laser treatment is not limited to the above glass substrate size, and can be applied to substrates of various sizes. By the laser treatment, crystallinity at an interface between the gate insulating film and the microcrystalline semiconductor film is improved, and an effect of improving electrical characteristics of the thin film transistor with a bottom gate structure is achieved. In such critical growth, roughness (convex bodies called "ridges") on a surface observed in conventional low-temperature polycrystalline silicon is not formed, and smoothness is maintained on a surface of a semiconductor film after laser treatment. As in this embodiment mode, a microcrystalline semiconductor film that is obtained by emitting a laser beam directly on a microcrystalline semiconductor film after film formation step has a growth mechanism and film quality that are clearly different from those of a microcrystalline semiconductor film that is simply accumulated or those of a microcrystalline semiconductor film that is modified by conduction heating (described in Non-Patent Document 1).

The buffer layer 104 can be formed by a plasma CVD method using silicon hydride such as $SiH_4$ or $Si_2H_6$. Alternatively, by dilution of silicon hydride mentioned above with one or plural kinds of rare gas elements selected from helium, argon, krypton, and neon, an amorphous semiconductor film can be formed. With use of hydrogen at a flow rate which is 1 to 20 times, preferably, 1 to 10 times, more preferably, 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed.

Alternatively, as the buffer layer 104, an amorphous semiconductor film can be formed by sputtering with hydrogen or a rare gas using an amorphous semiconductor as a target. In this case, by inclusion of ammonia, nitrogen, or $N_2O$ in an atmosphere, a nitrogen-containing amorphous semiconductor film can be formed. Alternatively, by inclusion of a gas including fluorine, chlorine, bromine, or iodine ($F_2$, $Cl_2$, $Br_2$, $I_2$, HF, HCl, HBr, HI, or the like) in an atmosphere, an amorphous semiconductor film containing fluorine, chlorine, bromine, or iodine can be formed.

Still alternatively, the buffer layer 104 may be formed by using an amorphous semiconductor film on a surface of the microcrystalline semiconductor film 103 by a plasma CVD method or a sputtering method, and then hydrogenation, nitridation, or halogenation of a surface of the amorphous semiconductor film may be performed through processing with hydrogen plasma, nitrogen plasma, or halogen plasma. Yet alternatively, the surface of the amorphous semiconductor film may be processed with helium plasma, neon plasma, argon plasma, krypton plasma, or the like.

The buffer layer 104 is preferably formed using an amorphous semiconductor film which does not contain microcrystal grains. Therefore, when the buffer layer 104 is formed by a high-frequency plasma CVD method or a microwave plasma CVD method with a frequency of several tens of megahertz to several hundred megahertz, formation conditions are preferably controlled such that an amorphous semiconductor film does not contain microcrystal grains.

The buffer layer 104 is partly etched in a later process for forming source and drain regions in some cases, and in that case, the buffer layer 104 is preferably formed at such a thickness that a part of the buffer layer 104 is left after the etching. Typically, the thickness of the buffer layer is preferably from 150 nm to 400 nm. In a liquid crystal display device in which application voltage to a multi-channel TFT is high (e.g., approximately 15 V), by setting the thickness of the buffer layer 104 within the above range, the withstand voltage is enhanced, and even when a high voltage is applied to a multi-channel TFT, the multi-channel TFT can be prevented from deteriorating.

By formation of an amorphous semiconductor film, moreover, an amorphous semiconductor film containing hydrogen, nitrogen, or halogen, on the surface of the microcrystalline semiconductor film 103, surfaces of microcrystal grains contained in the microcrystalline semiconductor film 103 can be prevented from being oxidized naturally. In particular, in a region where an amorphous semiconductor is in contact with microcrystal grains, a crack is likely to be formed due to localized stress. When this crack is exposed to oxygen, the microcrystal grains are oxidized, whereby silicon oxide is formed. However, by formation of the buffer layer on the surface of the microcrystalline semiconductor film 103, the microcrystal grains can be prevented from being oxidized. Furthermore, by formation of the buffer layer, the microcrystalline semiconductor film can be prevented from being mixed with an etching residue which is generated in forming source and drain regions later.

The buffer layer 104 is formed using an amorphous semiconductor film or an amorphous semiconductor film containing hydrogen, nitrogen, or halogen. An amorphous semiconductor film has a larger energy gap than the microcrystalline semiconductor film (the energy gap of the amorphous semiconductor film is 1.1 eV to 1.5 eV and the energy gap of the microcrystalline semiconductor film is 1.6 eV to 1.8 eV) and has a higher resistance, and has a lower mobility, i.e., a fifth to a tenth of that of the microcrystalline semiconductor film. Therefore, the buffer layer formed between the microcrystalline semiconductor film and source and drain regions in a multi-channel TFT to be formed later functions as a high-resistant region and the microcrystalline semiconductor film functions as a channel formation region. Accordingly, the off current of the multi-channel TFT can be reduced. When the multi-channel TFT is used as a switching element of a liquid crystal display device, the contrast of the liquid crystal display device can be improved.

Note that after forming the microcrystalline semiconductor film, an amorphous silicon hydride film may be formed by a plasma CVD method at 300° C. to 400° C. as the buffer layer. By this film forming process, hydrogen is supplied to the microcrystalline semiconductor film, and the same effect as hydrogenizing the microcrystalline semiconductor film can be obtained. In other words, by depositing an amorphous silicon hydride layer over the microcrystalline semiconductor film, hydrogen is dispersed in the microcrystalline semiconductor film and a dangling bond can be terminated.

Figure 10:
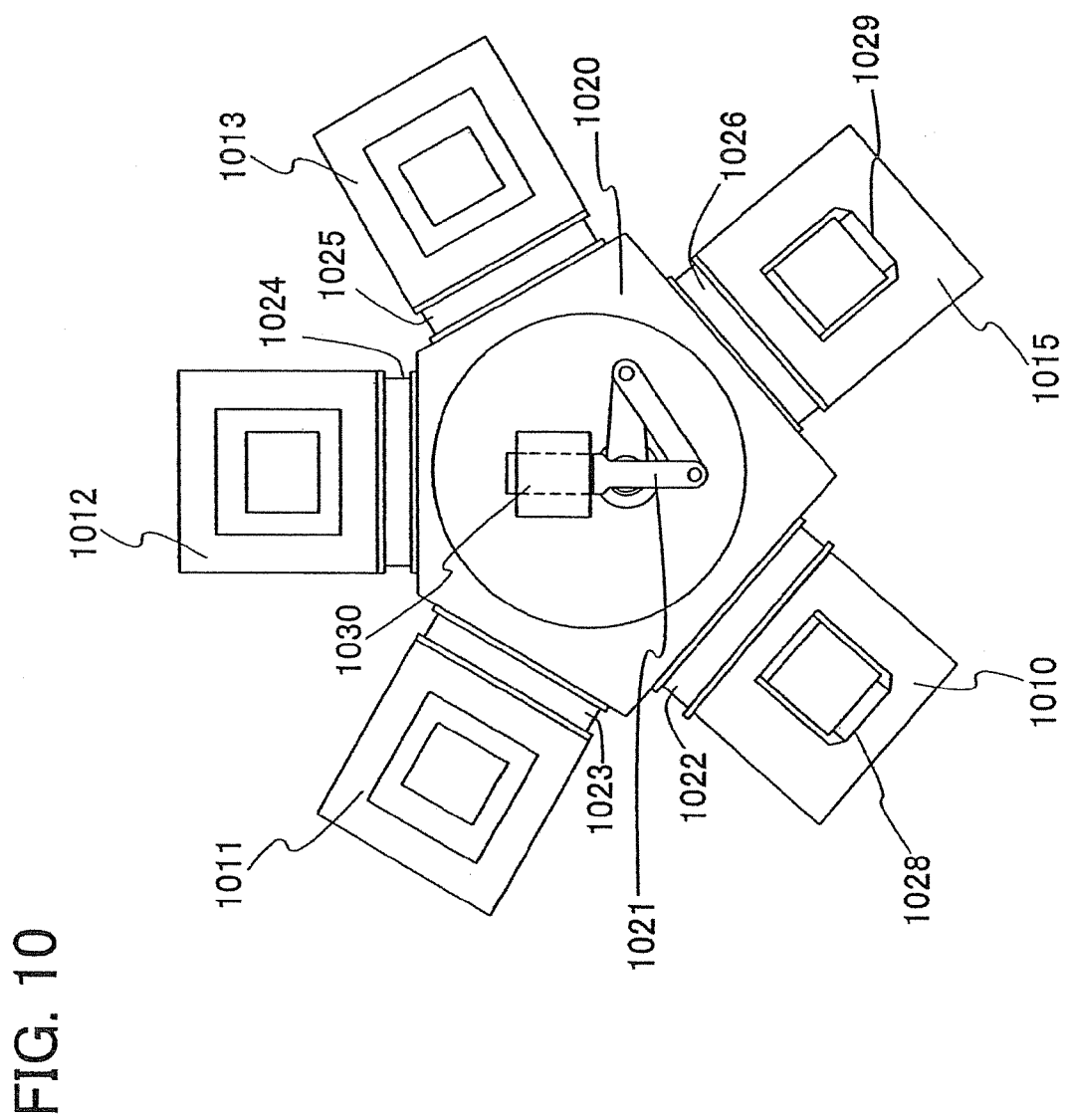
FIG. 10 is a top view showing a microwave plasma CVD apparatus.

Here, a plasma CVD apparatus that can successively form the gate insulating film 102 to the buffer layer 104 is described with reference to FIG. 10. FIG. 10 is a schematic diagram showing an upper cross-sectional view of a plasma CVD apparatus, which has a structure where a loading chamber 1010, an unloading chamber 1015, a reaction chamber (1) 1011, a reaction chamber (2) 1012, and a reaction chamber (3) 1013 are provided around a common chamber 1020. Between the common chamber 1020 and the other chambers, gate valves 1022 to 1026 are provided so that processes performed in the chambers do not interfere with each other. Substrates are loaded into a cassette 1028 in the loading chamber 1010 and a cassette 1029 in the unloading chamber 1015 and carried to the reaction chambers (1) 1011 to (3) 1013 with a transport means 1021 of the common chamber 1020. In this apparatus, a reaction chamber can be allocated for each of different kinds of deposition films, and a plurality of different films can be formed successively without exposure to the atmosphere. For example, the plasma CVD apparatus can have a structure in which the gate insulating film 102 is formed in the reaction chamber (1) 1011, the microcrystalline semiconductor film 103 and the buffer layer 104 are formed in the reaction chamber (2) 1012 as stacked layers, and the reaction chamber (3) 1013 is left as a spare chamber.

In this manner, with a microwave plasma CVD apparatus where a plurality of chambers is connected, the gate insulating film 102, the microcrystalline semiconductor film 103, and the buffer layer 104 can be formed at the same time. Thus, mass productivity can be improved. In addition, even when maintenance or cleaning is performed in one of reaction chambers, film formation processes can be performed in the other reaction chambers, whereby takt time for film formation can be shortened. Furthermore, each interface between stacked layers can be formed without being contaminated by an atmospheric constituent or a contaminant impurity element floating in the atmosphere. Thus, variations in characteristics of thin film transistors can be reduced.

Note that the microwave plasma CVD apparatus illustrated in FIG. 10 is provided with the loading chamber and the unloading chamber separately, which may be a single loading/unloading chamber. In addition, the plasma CVD apparatus may be provided with a plurality of spare chambers. By preheating of a substrate in the spare chamber, heating time needed before film formation in each reaction chamber can be shortened; thus, throughput can be improved.

Referring back to FIG. 1A, the resist can be a positive resist or a negative resist. In this embodiment mode, a positive resist is used and a resist mask 151 is formed using a second photomask. Further, as illustrated in FIG. 1B, the microcrystalline semiconductor film 103 and the buffer layer 104 are etched using the resist mask 151 formed over the buffer layer, and an island-shaped semiconductor film 105a (also called the first island-shaped semiconductor film) and an island-shaped semiconductor film 105b (also called the second island-shaped semiconductor film) are formed over the gate electrode 101. FIG. 1B corresponds to a cross-sectional view of the diagram in FIG. 5A along a line A-B (excluding the gate insulating film 102).

Note that by making an end portion of each of the island-shaped semiconductor film 105a and the island-shaped semiconductor film 105b being tapered, occurrence of a leakage current between source and drain regions formed over the island-shaped semiconductor films 105a, 105b and the microcrystalline semiconductor film 103 at a bottom portion of the island-shaped semiconductor films 105a, 105b can be prevented. An taper angle of the end portion of the island-shaped semiconductor films 105a, 105b is 90° to 30°, preferably 80° to 45°. By having such an angle, disconnection of the source electrode or the drain electrode due to a step can be prevented.

Next, a conductive semiconductor film 106 is formed to cover the island-shaped semiconductor film 105a and the island-shaped semiconductor film 105b. At this time, it is important that the conductive semiconductor film 106 be provided between the island-shaped semiconductor film 105a and the island-shaped semiconductor film 105b so as to be in contact with the gate insulating film 102, as illustrated in FIG. 2A. The conductive semiconductor film 106 provided in contact with the gate insulating film 102 that exists between the island-shaped semiconductor film 105a and the island-shaped semiconductor film 105b functions as a path for current in a multi-channel TFT that is formed later.

In the case of forming an n-channel multi-channel TFT, phosphor may be added to the conductive semiconductor film 106 as a typical impurity element, and an impurity gas such as PH$_3$ may be added to silicon hydride. Further, in the case of forming a p-channel multi-channel TFT, boron may be added as a typical impurity element, and an impurity gas such as B$_2$H$_6$ may be added to silicon hydride. The conductive semiconductor film 106 can be formed of a microcrystalline semiconductor or an amorphous semiconductor. Alternatively, the conductive semiconductor film 106 may be formed as stacked layers of an amorphous semiconductor film to which an impurity imparting one conductivity type is added and a microcrystalline semiconductor film to which an impurity imparting one conductivity type is added. By forming on a buffer layer 104 side an amorphous semiconductor film to which an impurity imparting one conductivity type is added, and then forming thereover a microcrystalline semiconductor film to which an impurity imparting one conductivity type is added, resistance becomes gradual; accordingly, carriers flow easily and mobility can be increased. The conductive semiconductor film 106 can be formed with a thickness of 2 nm to 50 nm. By making the thickness of the conductive semiconductor film thin, throughput can be improved.

Note that it is preferable that an impurity element imparting one conductivity type such as phosphorus or boron be not added to the buffer layer 104. In particular, it is preferable that boron contained in the microcrystalline semiconductor film for threshold control or phosphorus contained in a conductive semiconductor film be not mixed into the buffer layer 104. As a result of this, by elimination of a region where leakage current is generated due to an impurity, leakage current can be decreased. By formation of an amorphous semiconductor film, to which an impurity imparting one conductivity type such as phosphorus or boron is not added, between the conductive semiconductor film and the microcrystalline semiconductor film, the diffusion of the impurity contained in each of the microcrystalline semiconductor film and source and drain regions can be prevented.

Next, the conductive film 107 is formed over the conductive semiconductor film 106. Conductive film 107 is preferably formed using a single layer or stacked layers of aluminum, or an aluminum alloy to which an element to improve heat resistance or an element to prevent a hillock, e.g., copper, silicon, titanium, neodymium, scandium, or molybdenum, is added. Alternatively, the conductive film 107 may have a stacked-layer structure where a film in contact with the conductive semiconductor film is formed of titanium, tantalum, molybdenum, tungsten, or a nitride of any of these elements and an aluminum film or an aluminum alloy film is formed thereover. Still alternatively, the conductive film 107 may have a stacked-layer structure where an aluminum film or an aluminum alloy film is sandwiched between upper and lower films of titanium, tantalum, molybdenum, tungsten, or a nitride of any of these elements. Here, as the conductive film 107, a conductive film with a structure in which three conductive films are stacked is given, and examples are a stacked-layer conductive film where an aluminum film is sandwiched by molybdenum films and a stacked-layer conductive film where an aluminum film is sandwiched by titanium films. The conductive film 107 is formed by a sputtering method or a vacuum evaporation method.

As illustrated in FIG. 2B, resists are applied over the conductive film 107, and a resist mask 152 is formed using a third photomask. For the third photomask, a multi-tone mask may be used such as a gray tone mask or a half tone mask. By developing after light exposure using a multi-tone mask, a resist mask having regions with different thicknesses can be formed.

Next, the conductive semiconductor film 106 and the conductive film 107 are divided by etching using the resist mask 152. As a result, a region 108a, a region 108b, and a region 108c, each serving as a source region or a drain region in a multi-channel transistor structure as illustrated in FIG. 3A, can be formed. Note that in this etching step, a portion of the buffer layer 104 of each of the island-shaped semiconductor film 105a and the island-shaped semiconductor film 105b is also etched. Note that FIG. 3A corresponds to a cross-sectional view of the diagram in FIG. 5B along a line A-B (excluding the gate insulating film 102).

By the above process, a multi-channel TFT 109 can be formed. Further, a thin film transistor can be formed using three photomasks. Note that a "multi-channel thin film transistor" in this specification refers to a thin film transistor with a structure including a plurality of channels per a pair of source and drain regions. Using the multi-channel TFT 109 illustrated in FIG. 3A as an example, if the region 108a is a source region, carriers (electrons) pass through the channel region of the first island-shaped semiconductor film 105, the region 108b, and the channel region of the second island-shaped semiconductor film 105b, and flows into the region 108c which serves as a drain region.

In the inversely staggered multi-channel thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a depression is formed in a part of the buffer layer, and regions other than the depression are covered with the source and drain regions. That is, because there is distance between the source region and the drain region due to the depression formed in the buffer layer, leakage current between the source and drain regions can be reduced. In addition, because the depression is formed by etching of a part of the buffer layer, an etching residue which is generated in the formation step of the source and drain regions can be removed. Accordingly, leakage current (parasitic channel) can be prevented from being generated between the source and drain regions through the residue.

The buffer layer is formed between the microcrystalline semiconductor film that functions as a channel formation region and the source and drain regions. In addition, the buffer layer covers the surface of the microcrystalline semiconductor film. Because the buffer layer, which is formed to have higher resistance than the microcrystalline semiconductor film, is extended to regions between the microcrystalline semiconductor film and the source and drain regions, occurrence of leakage current can be reduced, and deterioration due to application of high voltage can be suppressed. Moreover, because the amorphous semiconductor film, the surface of which is subjected to termination by hydrogen, is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Accordingly, the thin film transistor has excellent electric characteristics and excellent withstand voltage.

Next, as illustrated in FIG. 3A, the insulating film 110 is formed over the multi-channel TFT 109. The insulating film 110 can be formed in a similar manner to the gate insulating film 102. Note that the insulating film 110 is provided to prevent entry of a contaminant impurity such as an organic substance, a metal substance, or moisture floating in the atmosphere and is preferably a dense film. By use of a silicon nitride film as the insulating film 110, the oxygen concentration in the buffer layer 104 can be made to be $5\times10^{19}$ atoms/cm$^3$ or less, preferably, $1\times10^{19}$ atoms/cm$^3$ or less.

Figure 4B:
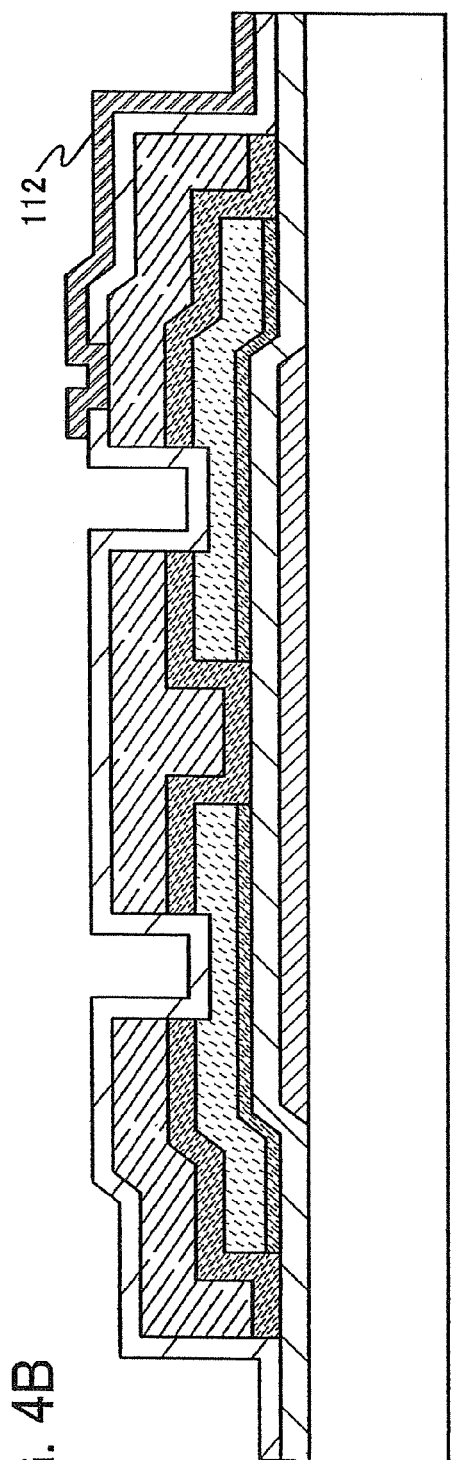

Next, as illustrated in FIG. 4A, a contact hole 111 is formed in the insulating film 110. Then, as illustrated in FIG. 4B, a pixel electrode 112 in contact with the region 108c is formed in the contact hole 111. Note that FIG. 4B corresponds to a cross-sectional view of the diagram in FIG. 5C along a line A-B.

The pixel electrode 112 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 112 can be formed using a conductive composition containing a conductive high-molecular compound (also referred to as a conductive polymer). It is preferable that the pixel electrode formed using the conductive composition have a sheet resistance of 10000 Ω/square or less and a light transmittance of 70% or more at a wavelength of 550 nm. In addition, it is preferable that the resistivity of the conductive high-molecular compound contained in the conductive composition be 0.1 Ω·cm or less.

As the conductive high-molecular compound, a so-called π electron conjugated conductive high-molecular compound can be used. Examples include polyaniline and its derivatives, polypyrrole and its derivatives, polythiophene and its derivatives, copolymers of two or more kinds of them, and the like.

Accordingly, an element substate that can be used in a liquid crystal display device can be formed.

Next, a characteristic of the multi-channel TFT of the present invention is described using diagrams that correspond to a top view and a cross-sectional view of the multi-channel TFT of the present invention described in FIGS. 1A and 1B, FIGS. 2A and 2B, FIGS. 3A and 3B, FIGS. 4A and 4B, and FIGS. 5A to 5C.

Figure 5A:
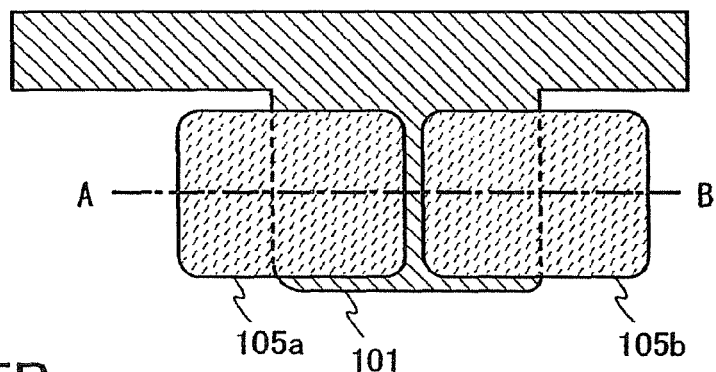
FIGS. 5A to 5C are top views showing a manufacturing method of a liquid crystal display device of the present invention.
Figure 5B:
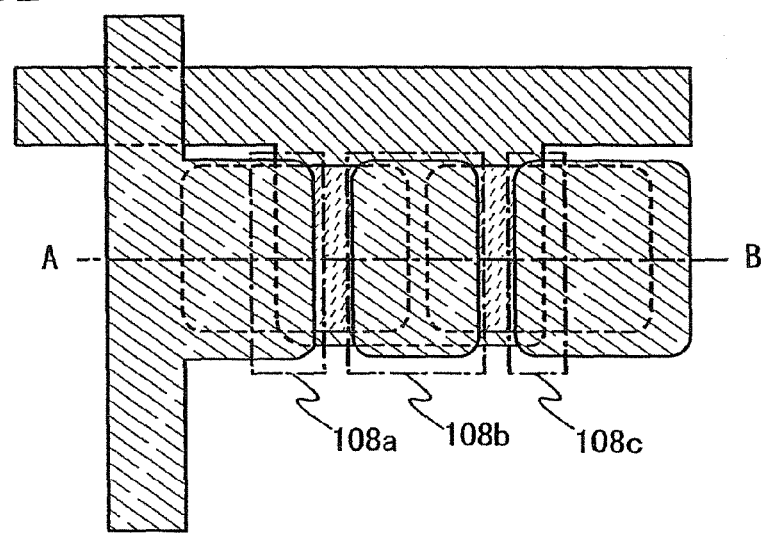
Figure 5C:
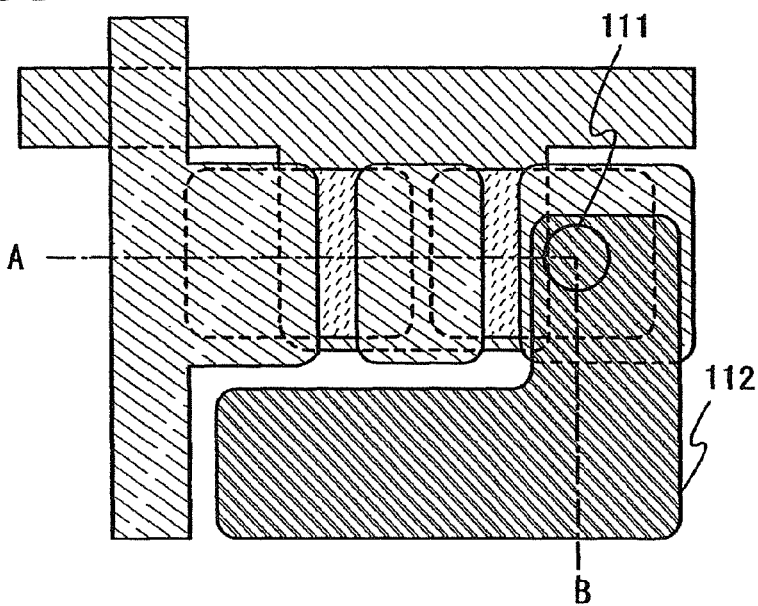
Figure 6A:
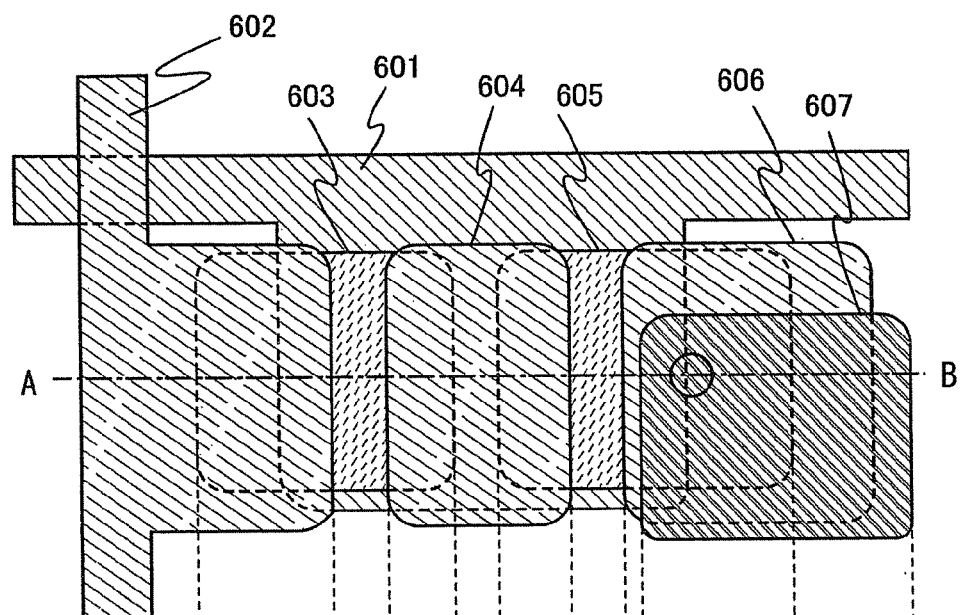
FIGS. 6A and 6B are a top view and a cross-sectional view showing a liquid crystal display device of the present invention.
Figure 6B:
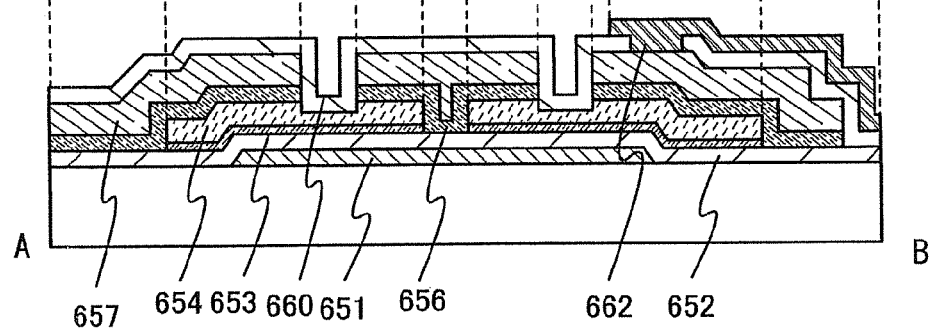

The top view illustrated in FIG. 6A corresponds to the top view illustrated in FIG. 5C. In addition, FIG. 6B illustrating a cross-sectional view along a line A-B of the top view illustrated in FIG. 6A corresponds to the cross-sectional view illustrated in FIG. 4B. The top view in FIG. 6A illustrates an arrangement of a scan line 601, a signal line 602, a first island-shaped semiconductor film 603, a first island-shaped electrode 604, a second island-shaped semiconductor film 605, a second island-shaped electrode 606, and a pixel electrode 607.

In addition, a conductive film, an insulating film, and the like that form the above-described multi-channel TFT are stacked and provided for the wirings and electrodes in FIG. 6B. In a similar manner to FIGS. 1A and 1B, FIGS. 2A and 2B, FIGS. 3A and 3B, FIGS. 4A and 4B, and FIGS. 5A to 5C, a gate insulating film 652, a microcrystalline semiconductor film 653, a buffer layer 654, a conductive semiconductor film 656, a conductive film 657, an insulating film 660, and a pixel electrode 662 are stacked and provided over a gate electrode 651 that extends from the scan line 601. Note that it is acceptable as long as the gate electrode 651 is provided to overlap with the channel region of the microcrystalline semiconductor film 653, and the gate electrode may branch out into a plurality of gate electrodes to be arranged.

In the case where the multi-channel TFT illustrated in FIG. 6A is an n-channel transistor, carriers flow between the signal line 602 and the pixel electrode 607, through the first island-shaped semiconductor film 603, the first island-shaped electrode 604, the second island-shaped semiconductor film 605, and the second island-shaped electrode 606. In other words, the carriers move through two places; the channel region of the first island-shaped semiconductor film 603 and the channel region of the second island-shaped semiconductor film 605 illustrated in FIG. 6A. Accordingly, occurrence of a leakage current from the pixel electrode 607 to the signal line 602 can be drastically suppressed. Further, a current that flows between the signal line 602 and the pixel electrode 607 when the multi-channel TFT is turned on flows through the microcrystalline semiconductor film 653 of the first island-shaped semiconductor film 603 and the second island-shaped semiconductor film 605; therefore, a field-effect mobility of 1 cm$^2$/V·sec to 20 cm$^2$/V·sec can be obtained.

Further, the multi-channel TFT described in this embodiment mode is an inversely staggered thin film transistor. This inversely staggered thin film transistor requires a smaller number of manufacturing steps and can achieve cost reduction. In addition, by formation of a channel formation region with a microcrystalline semiconductor film, a field-effect mobility of 1 cm$^2$/V·sec to 20 cm$^2$/V·sec can be achieved. Accordingly, this thin film transistor can be used as a switching element of a pixel in a pixel portion and as an element included in a scan line (gate line) side driver circuit.

According to this embodiment mode, a thin film transistor with highly reliable electrical characteristics can be manufactured.

Embodiment Mode 2

In this embodiment mode, diagrams that correspond to a top view and a cross-sectional view of the multi-channel TFT described in above Embodiment Mode 1 that are different in structure from those illustrated in FIGS. 6A and 6B are described.

Figure 7A:
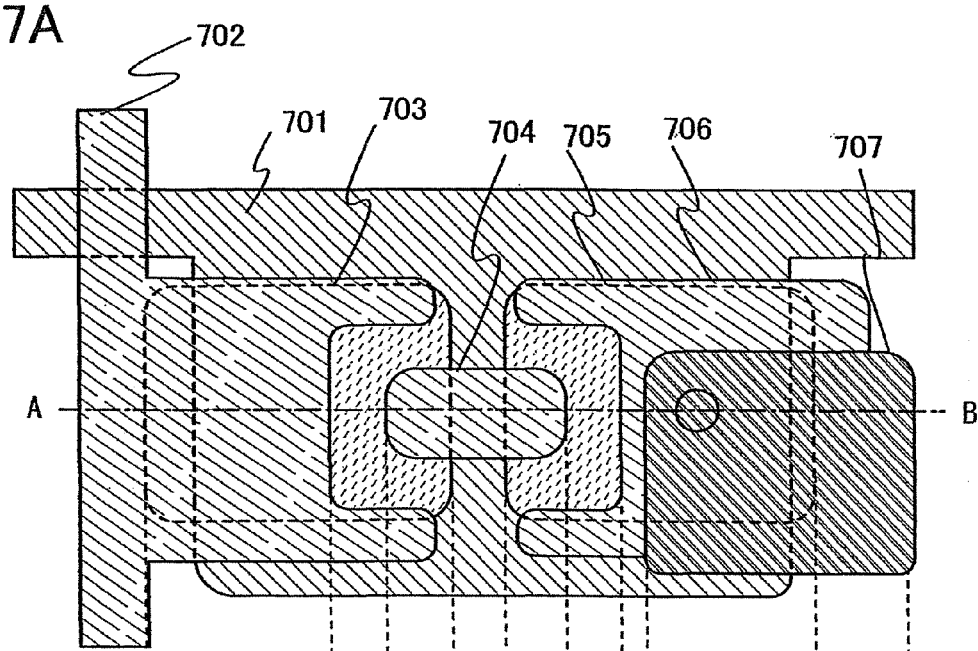
FIGS. 7A and 7B are a top view and a cross-sectional view showing a liquid crystal display device of the present invention.
Figure 7B:
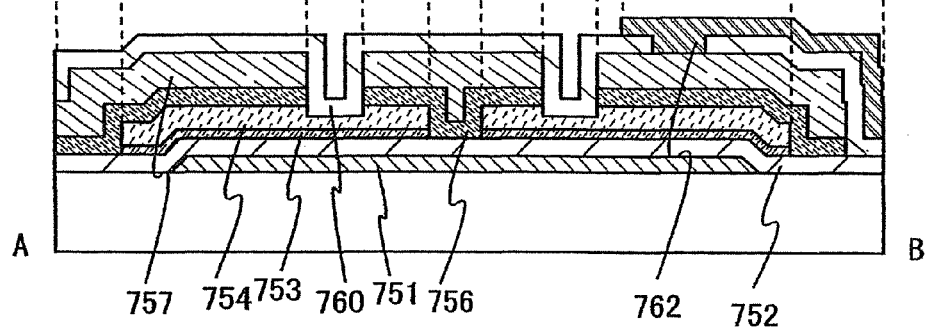

The top view illustrated in FIG. 7A illustrates an arrangement of a scan line 701, a signal line 702, a first island-shaped semiconductor film 703, a first island-shaped electrode 704, a second island-shaped semiconductor film 705, a second island-shaped electrode 706, and a pixel electrode 707.

In addition, in a similar manner to FIG. 6B, a conductive film, an insulating film, and the like that form a multi-channel TFT are stacked and provided for the wirings and electrodes in FIG. 7A. In a similar manner to FIGS. 1A and 1B, FIGS. 2A and 2B, FIGS. 3A and 3B, FIGS. 4A and 4B, and FIGS. 5A to 5C of above Embodiment Mode 1, a gate insulating film 752, a microcrystalline semiconductor film 753, a buffer layer 754, a conductive semiconductor film 756, a conductive film 757, an insulating film 760, and a pixel electrode 762 are stacked over a gate electrode 751 that extends from the scan line 701.

Figure 9A:
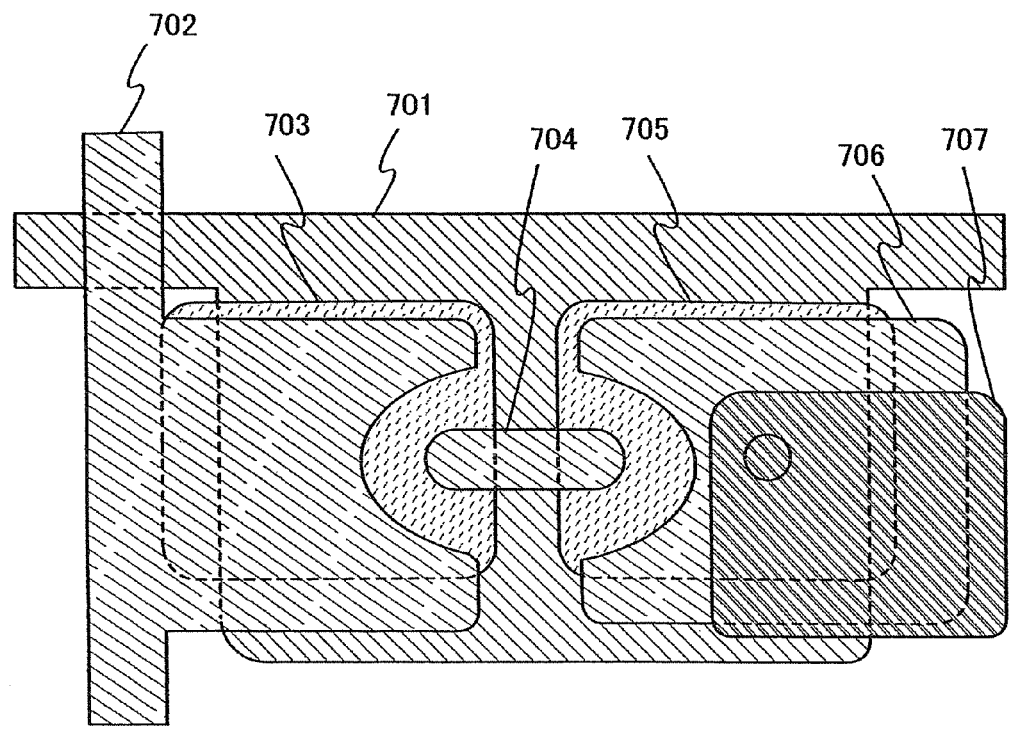
FIGS. 9A and 9B are top views showing a liquid crystal display device of the present invention.

A difference between FIG. 7A and FIG. 6A is that a top view of the first island-shaped electrode 704 has a shape that is surrounded by a conductive film that extends from the signal line 702 and the second island-shaped electrode 706, which is a conductive film that is connected to the pixel electrode 707. Specifically, top views of the conductive film that extends from the signal line 702 and the second island-shaped electrode 706 that is a conductive film connected to the pixel electrode 707, are each C-like shaped (or U-like shaped). At this time, since the top view of the first island-shaped electrode 704 has a shape that is surrounded by the C-like shaped conductive film and the C-like shaped second island-shaped electrode 706 that is a conductive film connected to the pixel electrode 707, it is preferable that the first island-shaped electrode 704 is round-shaped, elliptical-shaped, or rectangular-shaped. Note that as illustrated in FIG. 9A, the distance between the conductive film extending from the signal line 702 and the first island-shaped electrode 704 that face each other are approximately the same, the distance between the second island-shaped electrode 706 and the first island-shaped electrode 704 that face each other are approximately the same, and accordingly, variation in movement distance of carriers flowing through the channel region can be reduced. By the conductive film and the second island-shaped electrode 706 connected to the pixel electrode 707 each being C-like shaped, it is possible to increase an area of the channel region of a multi-channel TFT through which carriers move; accordingly, amount of current can be increased, and an area of the multi-channel TFT can be reduced.

Note that in the case where the multi-channel TFT illustrated in FIG. 7A is an n-channel transistor, electrons which are carriers flow between the signal line 702 and the pixel electrode 707 through the first island-shaped semiconductor film 703, the first island-shaped electrode 704, the second island-shaped semiconductor film 705, and the second island-shaped electrode 706, in a similar manner to FIG. 6A. In other words in a similar manner to FIG. 6B, carriers move through two places, a channel region of the first island-shaped semiconductor film 703 and a channel region of the second island-shaped semiconductor film 705 illustrated in FIG. 7B. Accordingly, occurrence of a leakage current from the pixel electrode 707 to the signal line 702 can be drastically suppressed. Further, a current that flows between the signal line 702 and the pixel electrode 707 when the multi-channel TFT is turned on flows through the microcrystalline semiconductor film 753 of the first island-shaped semiconductor film 703 and the second island-shaped semiconductor film 705; therefore, a field-effect mobility of 1 $cm^2/V \cdot sec$ to 20 $cm^2/V \cdot sec$ can be obtained.

Further, the multi-channel TFT described in this embodiment mode is an inversely staggered thin film transistor. This inversely staggered thin film transistor requires a smaller number of manufacturing steps and can achieve cost reduction. In addition, by formation of a channel formation region with a microcrystalline semiconductor film, a field-effect mobility of 1 $cm^2/V \cdot sec$ to 20 $cm^2/V \cdot sec$ can be achieved. Accordingly, this thin film transistor can be used as a switching element of a pixel in a pixel portion and as an element included in a scan line (gate line) side driver circuit.

According to this embodiment mode, a thin film transistor with highly reliable electrical characteristics can be manufactured.

Embodiment Mode 3

In this embodiment mode, diagrams that correspond to a top view and a cross-sectional view of the multi-channel TFT described in above Embodiment Modes 1 and 2 that are different from those illustrated in FIGS. 6A and 6B, and FIGS. 7A and 7B are described.

Figure 8A:
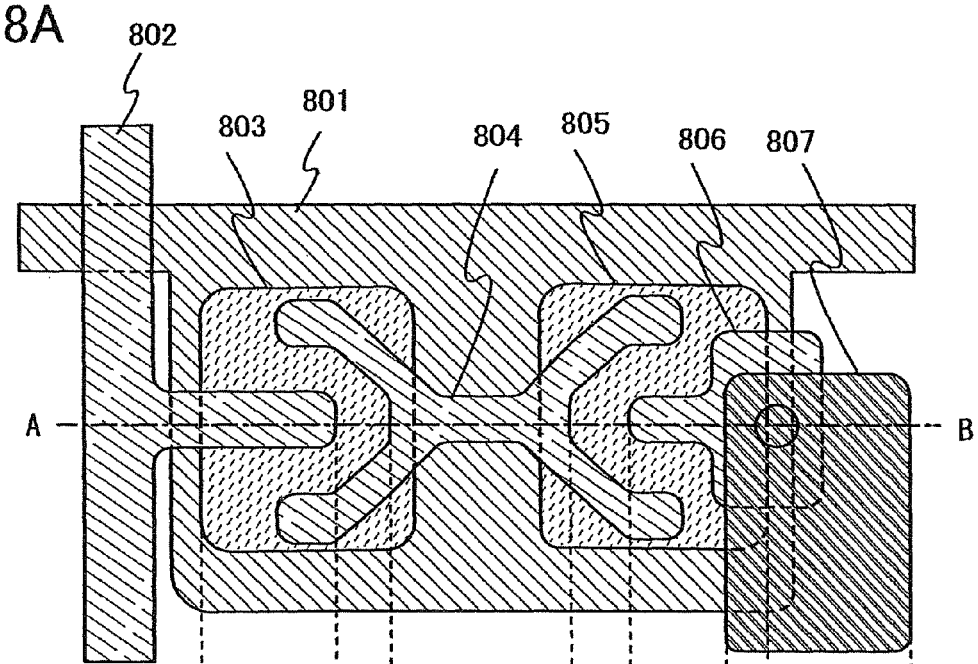
FIGS. 8A and 8B are a top view and a cross-sectional view showing a liquid crystal display device of the present invention.
Figure 8B:
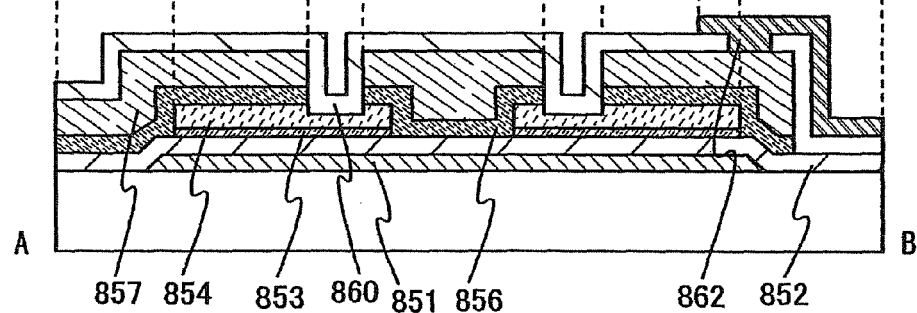

The top view illustrated in FIG. 8A illustrates an arrangement of a scan line 801, a signal line 802, a first island-shaped semiconductor film 803, a first island-shaped electrode 804, a second island-shaped semiconductor film 805, a second island-shaped electrode 806, and a pixel electrode 807.

In addition, in a similar manner to FIG. 6B, a conductive film, an insulating film, and the like that form a multi-channel TFT are stacked and provided for the wirings and electrodes in FIG. 8A. In a similar manner to FIGS. 1A and 1B, FIGS. 2A and 2B, FIGS. 3A and 3B, FIGS. 4A and 4B, and FIGS. 5A to 5C of above Embodiment Mode 1, a gate insulating film 852, a microcrystalline semiconductor film 853, a buffer layer 854, a conductive semiconductor film 856, a conductive film 857, an insulating film 860, and a pixel electrode 862 are stacked over a gate electrode 851 that extends from the scan line 801.

Figure 9B:
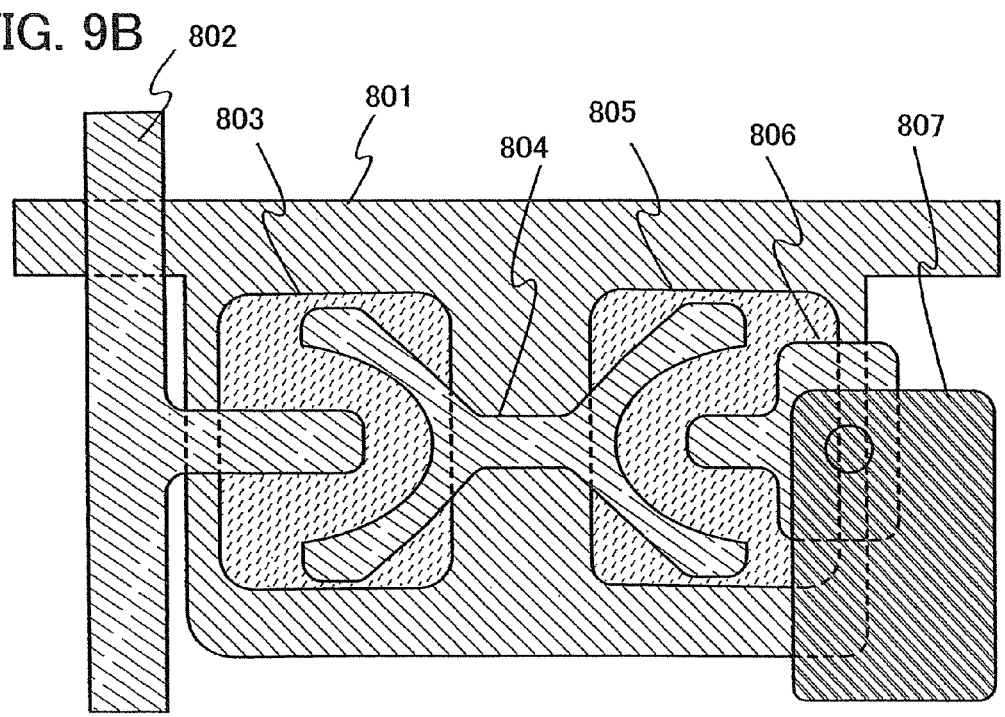

A difference between FIG. 8A and FIG. 6A is that a top view of the first island-shaped electrode 804 has a shape that surrounds a conductive film that extends from the signal line 802 and a part of the second island-shaped electrode 806, which is a conductive film that is connected to the pixel electrode 807. Specifically, the top view of the first island-shaped electrode 804 is X-like shaped. Similarly, the top view of the first island-shaped electrode 804 has a shape where two C-like shaped (or U-like shaped) conductive layers are arranged adjacent to each other to form an X-like shape as shown in FIG. 8A. At this time, top views of the conductive film extending from the signal line 802 and the second island-shaped electrode 806 that is a conductive film connected to the pixel electrode 807 each have a shape where they are surrounded by the first island-shaped electrode 804; accordingly, it is preferable that the conductive films that are surrounded by the X-like shaped first island-shaped electrode have elliptically shaped portions, or provided as a rectangular-shaped protruding portion. Note that as illustrated in FIG. 9B, the distance between the conductive film extending from the signal line 802 and the first island-shaped electrode 804 that face each other are approximately the same, the distance between the second island-shaped electrode 806 and the first island-shaped electrode 804 that face each other are approximately the same, and accordingly, variation in movement distance of carriers flowing through the channel region ca be reduced. By the first island-shaped electrode 804 being X-like shaped, it is possible to increase an area of a channel region of a multi-channel TFT; accordingly, an amount of current can be increased, and an area of the multi-channel TFT ca be reduced.

Note that when the multi-channel TFT illustrated in FIG. 8A is an n-channel transistor, electrons which are carriers flow between the signal line 802 and the pixel electrode 807, through the first island-shaped semiconductor film 803, the first island-shaped electrode 804, the second island-shaped semiconductor film 805, and the second island-shaped electrode 806, in a similar manner to FIG. 6A. In other words, in a similar manner to FIG. 6B, carriers move through two places, a channel region of the first island-shaped semiconductor film 803 and a channel region of the second island-shaped semiconductor film 805. Accordingly, occurrence of a leakage current from the pixel electrode 807 to the signal line 802 can be greatly suppressed. Further, a current that flows between the signal line 802 and the pixel electrode 807 when the multi-channel TFT is turned on flows through the microcrystalline semiconductor film 853 of the first island-shaped semiconductor film 803 and the second island-shaped semiconductor film 805; therefore, a field-effect mobility of 1 $cm^2/V \cdot sec$ to 20 $cm^2/V \cdot sec$ can be obtained.

Further, the multi-channel TFT described in this embodiment mode is an inversely staggered thin film transistor. This inversely staggered thin film transistor requires a smaller number of manufacturing steps and can achieve cost reduction. In addition, by formation of a channel formation region with a microcrystalline semiconductor film, a field-effect mobility of 1 $cm^2/V \cdot sec$ to 20 $cm^2/V \cdot sec$ can be achieved. Accordingly, this thin film transistor can be used as a switching element of a pixel in a pixel portion and as an element included in a scan line (gate line) side driver circuit.

According to this embodiment mode, a thin film transistor with highly reliable electrical characteristics can be manufactured.

Embodiment Mode 4

In this embodiment mode, a liquid crystal display device including the multi-channel TFT described in Embodiment Mode 1 is described.

First, a vertical alignment (VA) liquid crystal display device is described. A VA liquid crystal display device is a kind of a mode in which alignment of liquid crystal molecules of a liquid crystal panel is controlled. The VA liquid crystal display device is a mode in which liquid crystal molecules are vertical to a panel surface when voltage is not applied. In particular, in this embodiment mode, it is devised that a pixel is divided into several regions (sub-pixels) so that molecules are aligned in different directions in the respective regions. This is referred to as multi-domain design. In the following description, a liquid crystal display device with multi-domain design is described.

Figure 11:
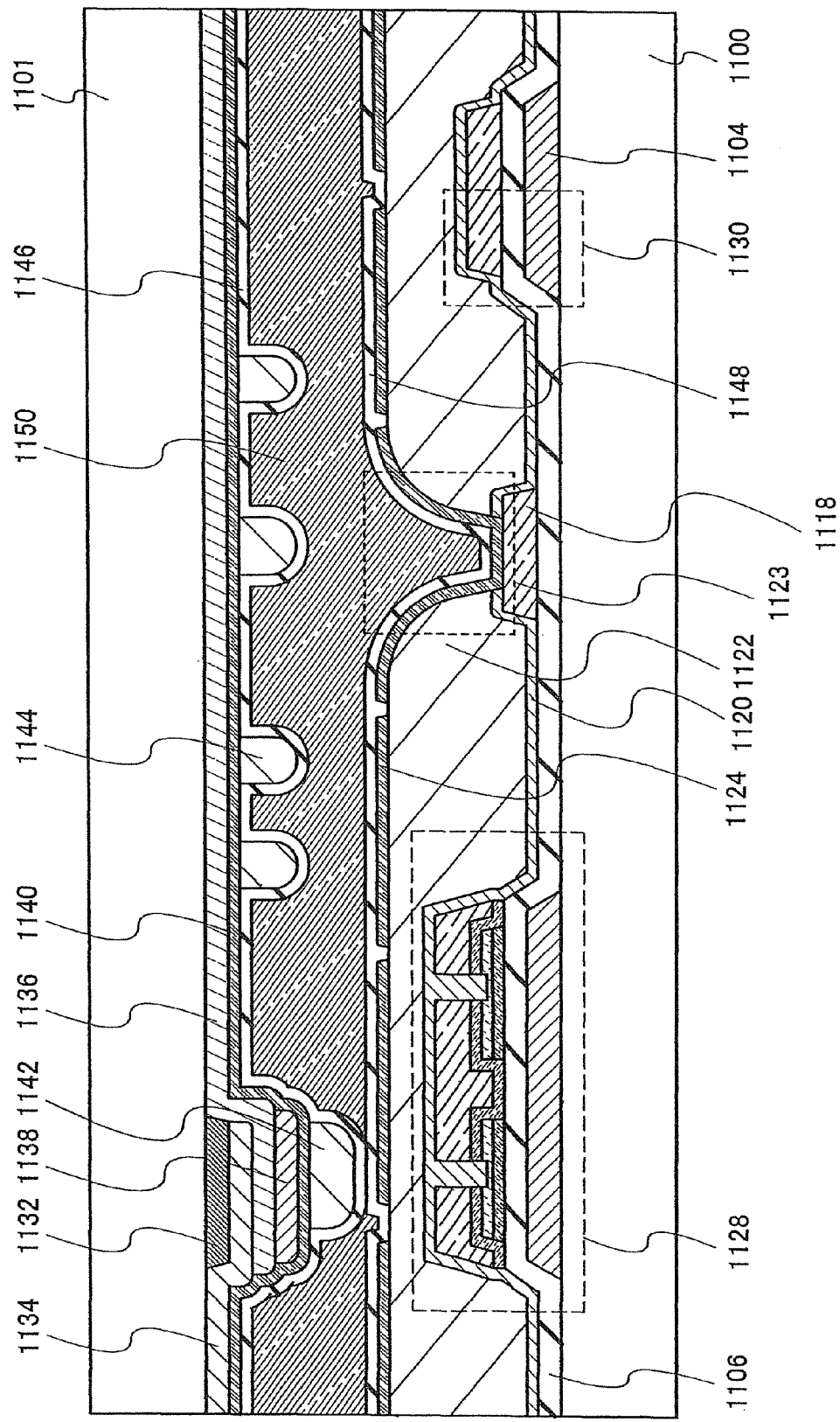
FIG. 11 is a diagram showing a liquid crystal display device of the present invention.
Figure 12:
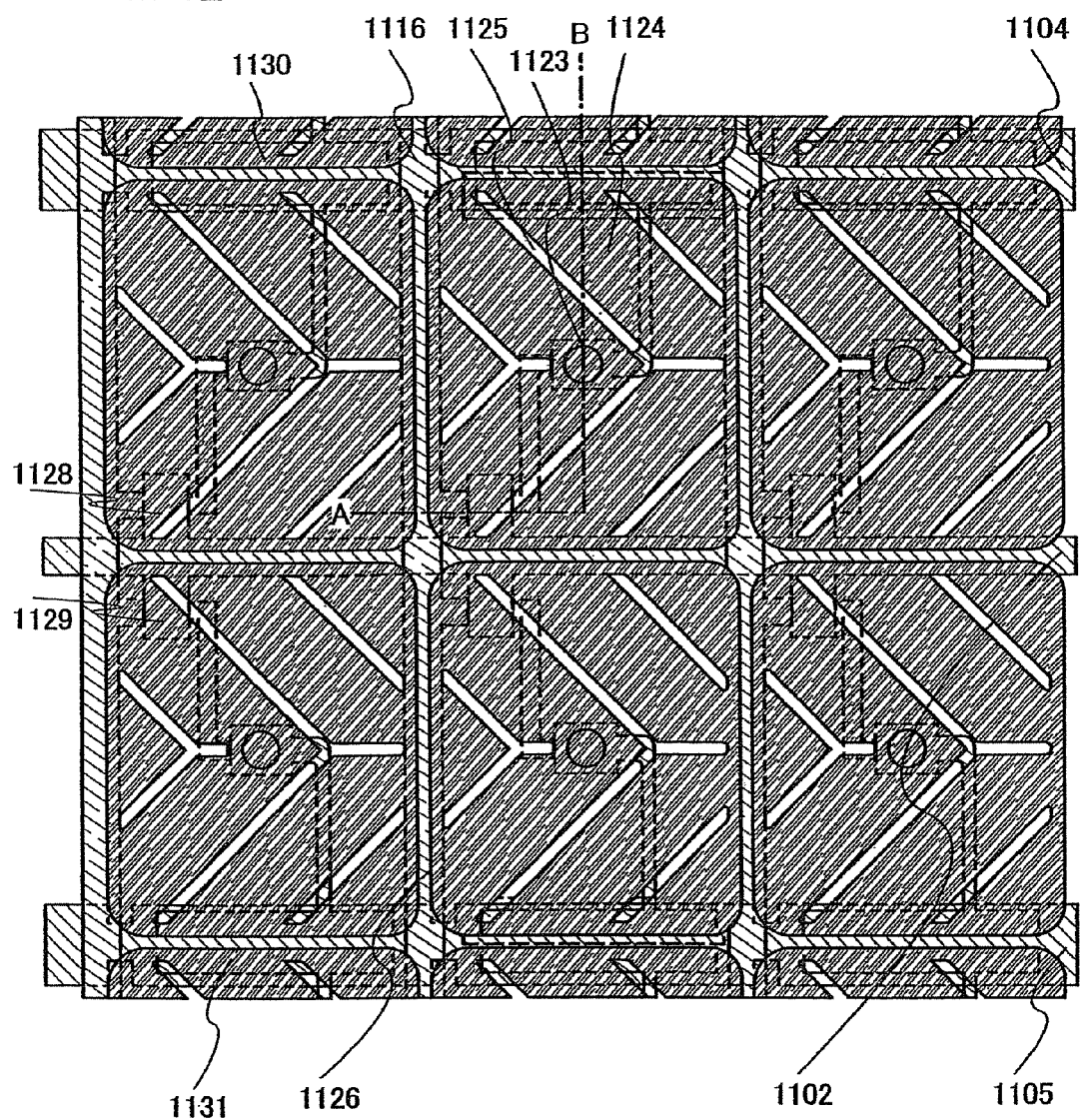
FIG. 12 is a diagram showing a liquid crystal display device of the present invention.
Figure 13:
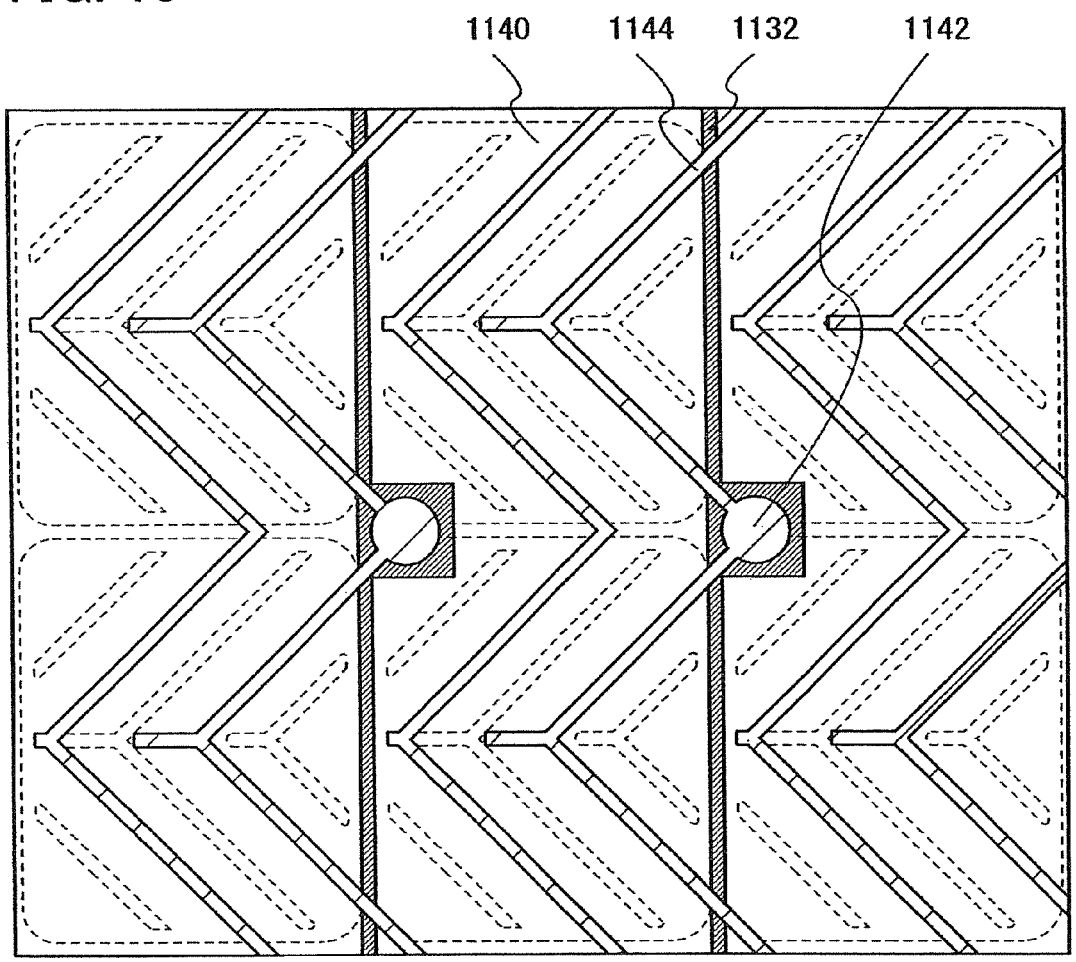
FIG. 13 is a diagram showing a liquid crystal display device of the present invention.
Figure 14:
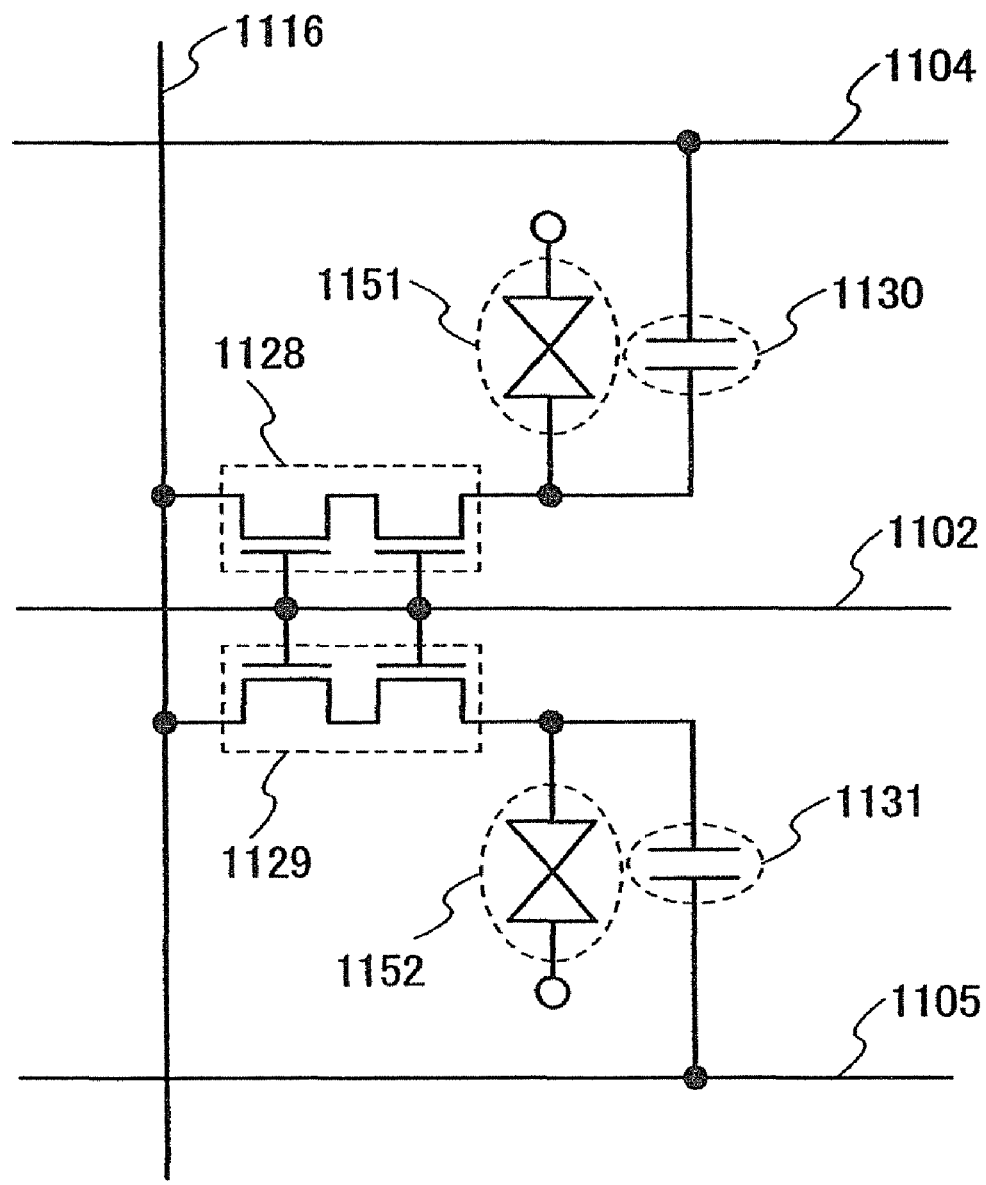
FIG. 14 is a diagram showing a liquid crystal display device of the present invention.

FIGS. 12 and 13 show a pixel electrode and a counter electrode, respectively. FIG. 12 is a plan view of a substrate on which the pixel electrode is formed. FIG. 11 shows a cross-sectional structure of the diagram in FIG. 12 along a line A-B. FIG. 13 is a plan view of a substrate on which the counter electrode is formed. Further, FIG. 14 is a circuit diagram of a pixel included in the liquid crystal display device. Hereinafter, description is made with reference to these drawings.

FIG. 11 illustrates a state in which a substrate 1100 provided with a multi-channel TFT 1128, a pixel electrode 1124 connected to the multi-channel TFT 1128, and a storage capacitor portion 1130 overlaps with a counter substrate 1101 provided with a counter electrode 1140 and the like, and a liquid crystal is injected therebetween.

At the position where the counter substrate 1101 is provided with a spacer 1142, a light shielding film 1132, a first colored film 1134, a second colored film 1136, a third colored film 1138 (a colored film is also cold color filter.), and the counter electrode 1140 are formed. With this structure, the height of a projection 1144 for controlling alignment of the liquid crystal and the height of the spacer 1142 vary. An alignment film 1148 is formed over the pixel electrode 1124. Similarly, the counter electrode 1140 is provided with an alignment film 1146. A liquid crystal layer 1150 is formed between the alignment films 1146 and 1148.

Although a columnar spacer is used for the spacer 1142 in this embodiment mode, a bead spacer may be dispersed. Further, the spacer 1142 may be formed over the pixel electrode 1124 provided over the substrate 1100.

The multi-channel TFT 1128, the pixel electrode 1124 connected to the multi-channel TFT 1128, and the storage capacitor portion 1130 are formed over the substrate 1100. The pixel electrode 1124 is connected to a wiring 1118 via a contact hole 1123 which penetrates an insulating film 1120 which covers the multi-channel TFT 1128, the wiring 1118, and the storage capacitor portion 1130 and also penetrates an insulating film 1122 which covers the insulating film 1120. The multi-channel TFT shown in Embodiment Modes 1 to 3 can be used as the multi-channel TFT 1128 as appropriate. The storage capacitor portion 1130 includes a first capacitor wiring 1104 which is formed in a similar manner to a gate wiring 1102 of the multi-channel TFT 1128, a gate insulating film 1106, and a second capacitor wiring 1117 which is formed in a similar manner to a wiring 1116 and the wiring 1118.

A liquid crystal element is formed by the pixel electrode 1124, the liquid crystal layer 1150, and the counter electrode 1140 overlapping with each other.

FIG. 12 shows a structure over the substrate 1100. The pixel electrode 1124 is formed using a material described in Embodiment Mode 1. The pixel electrode 1124 is provided with a slit 1125. The slit 1125 is for controlling alignment of the liquid crystal.

A multi-channel TFT 1129, a pixel electrode 1126 connected to the multi-channel TFT 1129, and a storage capacitor portion 1131 illustrated in FIG. 12 can be formed in a similar manner to the multi-channel TFT 1128, the pixel electrode 1124 and the storage capacitor portion 1130, respectively. Both the multi-channel TFT 1128 and the multi-channel TFT 1129 are connected to the wiring 1116. A pixel of this liquid crystal panel includes the pixel electrodes 1124 and 1126. Each of the pixel electrodes 1124 and 1126 is a sub-pixel.

FIG. 13 shows a structure of the counter substrate. The counter electrode 1140 is formed over the light shielding film 1132. The counter electrode 1140 is preferably formed using a material similar to a material of the pixel electrode 1124. The projection 1144 for controlling alignment of the liquid crystal is formed over the counter electrode 1140. Moreover, the spacer 1142 is formed corresponding to the position of the light shielding film 1132.

FIG. 14 shows a circuit diagram of this pixel structure. Both the multi-channel TFT 1128 and the multi-channel TFT 1129 are connected to the gate wiring 1102 and the wiring 1116. In this case, when potentials of the capacitor wiring 1104 and a capacitor wiring 1105 are different from each other, operations of liquid crystal elements 1151 and 1152 can vary. That is, alignment of the liquid crystal is precisely controlled and a viewing angle is increased by individual control of potentials of the capacitor wirings 1104 and 1105.

When voltage is applied to the pixel electrode 1124 provided with the slit 1125, electric field distortion (an oblique electric field) is generated near the slit 1125. The slit 1125 and the projection 1144 on the counter substrate 1101 are alternately arranged in an engaging manner and thus, an oblique electric field is effectively generated to control alignment of the liquid crystal, so that a direction of alignment of the liquid crystal varies depending on location. That is, a viewing angle of the liquid crystal panel is increased by multi-domain design.

Next, another VA liquid crystal display device, which is different from the above-described device, is described with reference to FIG. 15, FIG. 16, FIG. 17, and FIG. 18.

Figure 15:
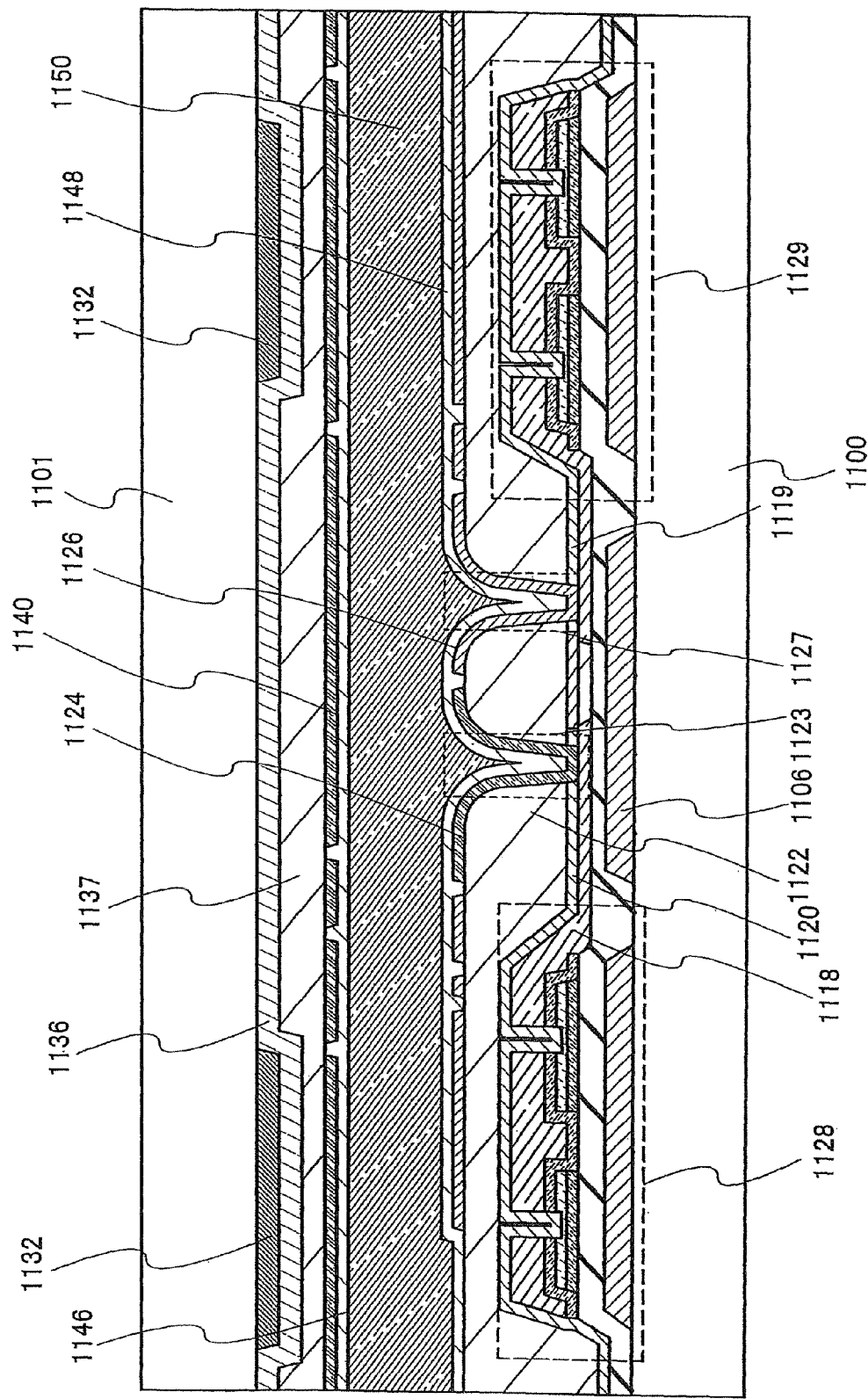
FIG. 15 is a diagram showing a liquid crystal display device of the present invention.
Figure 16:
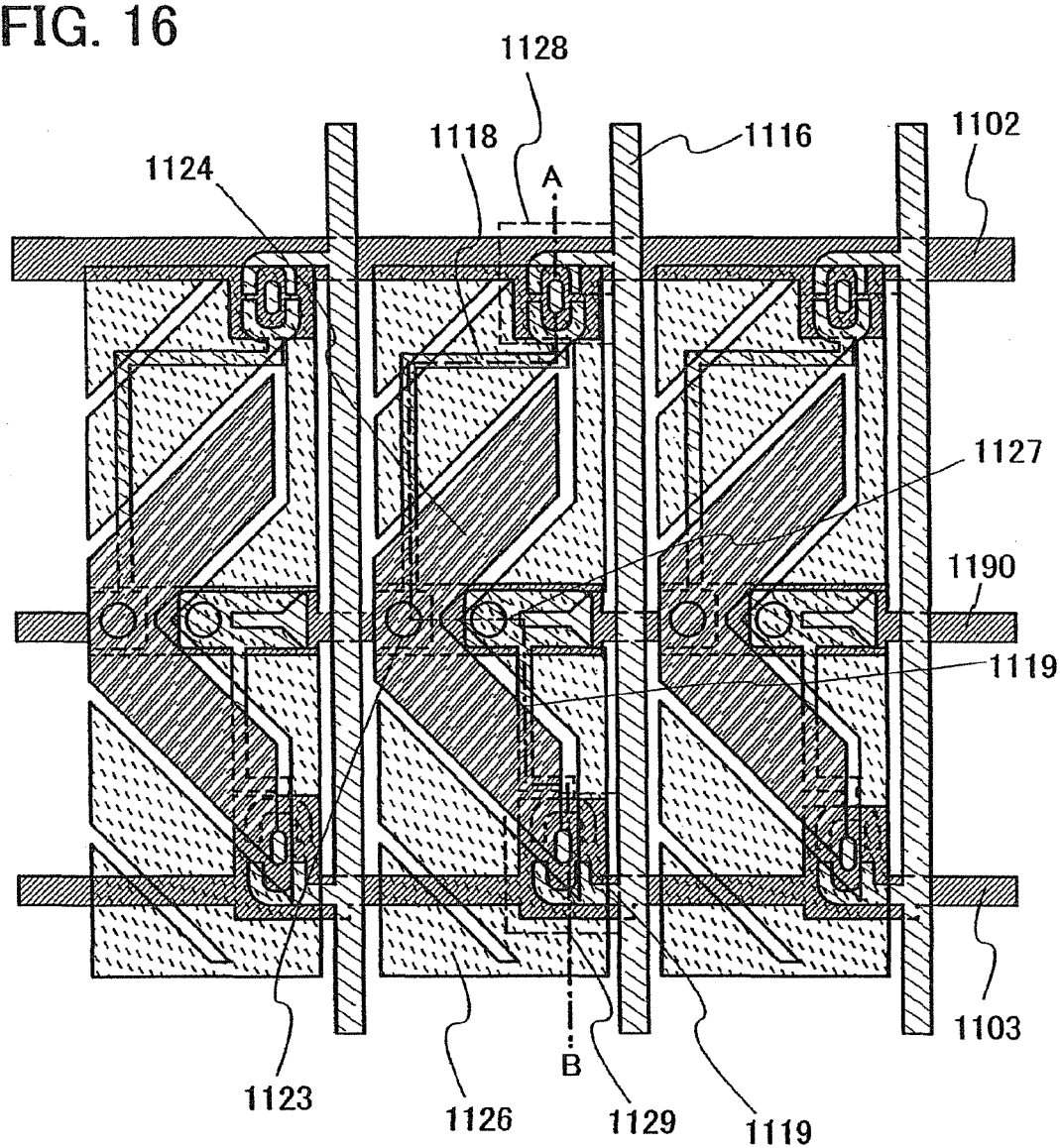
FIG. 16 is a diagram showing a liquid crystal display device of the present invention.

FIGS. 15 and 16 each show a pixel structure of the VA liquid crystal display device. FIG. 16 is a plan view of the substrate 1100. FIG. 15 shows a cross-sectional structure of the diagram in FIG. 16 along a line A-B. Hereinafter, description is made with reference to these drawings.

In the pixel structure described in FIG. 15, FIG. 16, FIG. 17, and FIG. 18, a plurality of pixel electrodes are included in one pixel, and a TFT is connected to each pixel electrode. Each multi-channel TFT is driven by a different gate signal. That is, a pixel with multi-domain design has a structure in which signals supplied to the respective pixel electrodes are individually controlled.

Via the contact hole 1123, the pixel electrode 1124 is connected to the multi-channel TFT 1128 using the wiring 1118. Via a contact hole 1127, the pixel electrode 1126 is connected to the multi-channel TFT 1129 using a wiring 1119. The gate wiring 1102 of the multi-channel TFT 1128 and a gate wiring 1103 of the multi-channel TFT 1129 are separated so that different gate signals can be given. In contrast, the wiring 1116 functioning as a data line is used in common for the multi-channel TFTs 1128 and 1129. As each of the multi-channel TFTs 1128 and 1129, any of the multi-channel TFTs shown in Embodiment Modes 1 to 3 can be used as appropriate.

Figure 18:
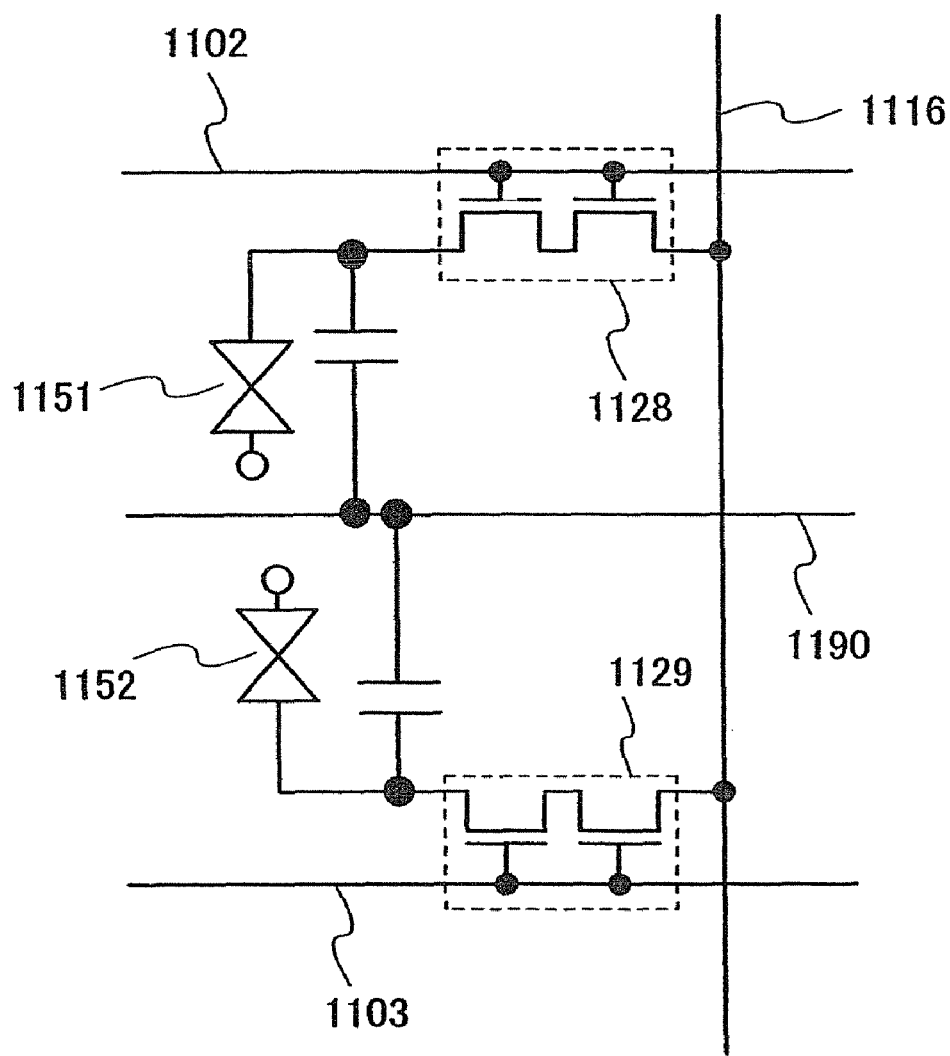
FIG. 18 is a diagram showing a liquid crystal display device of the present invention.

The pixel electrodes 1124 and 1126 have different shapes and are separated by a slit. The pixel electrode 1126 is formed so as to surround the external side of the pixel electrode 1124 which is spread in a V-shape. Timing of voltage application is made to vary between the pixel electrodes 1124 and 1126 by the multi-channel TFTs 1128 and 1129 in order to control alignment of the liquid crystal. FIG. 18 shows an circuit diagram of this pixel structure. The multi-channel TFT 1128 is connected to the gate wiring 1102. The multi-channel TFT 1129 is connected to the gate wiring 1103. When different gate signals are supplied to the gate wirings 1102 and 1103, operation timings of the multi-channel TFTs 1128 and 1129 can vary.

Figure 17:
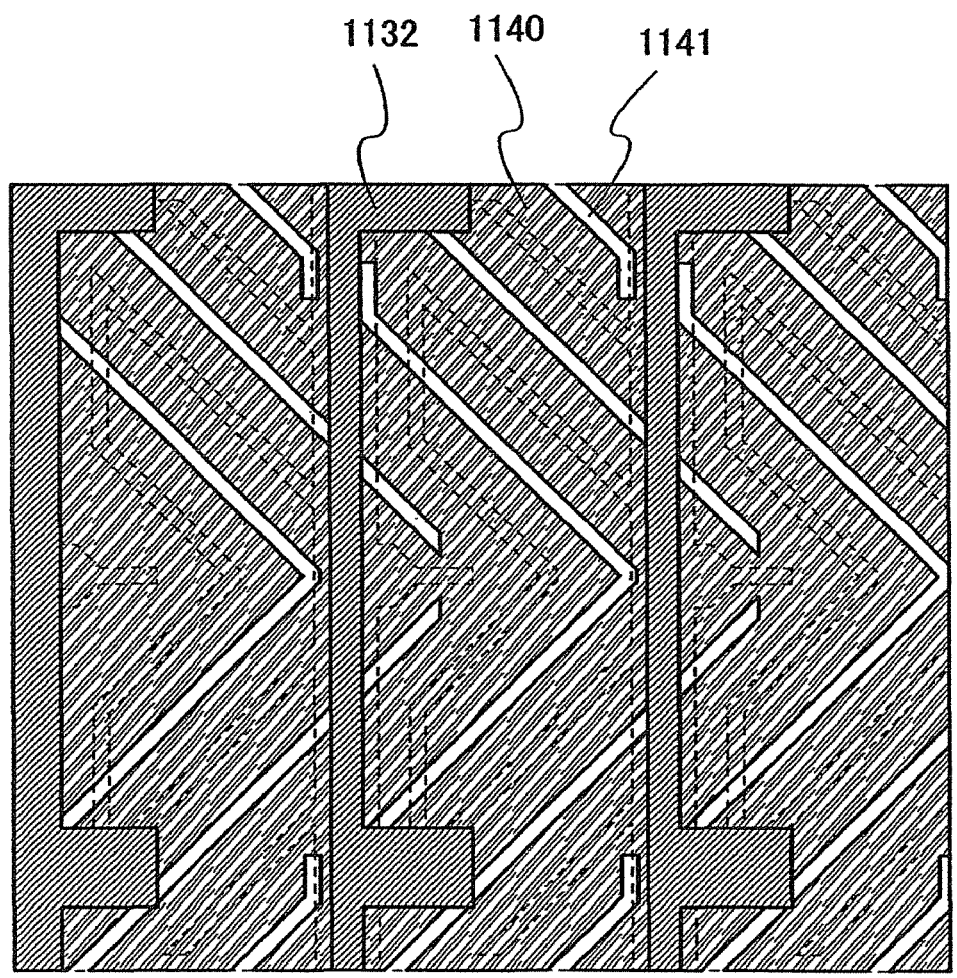
FIG. 17 is a diagram showing a liquid crystal device of the present invention.

The counter substrate 1101 is provided with the light shielding film 1132, the second colored film 1136, and the counter electrode 1140. Moreover, a planarization film 1137 is formed between the second colored film 1136 and the counter electrode 1140 to prevent alignment disorder of the liquid crystal. FIG. 17 shows a structure on the counter substrate. A slit 1141 is formed in the counter electrode 1140, which is used in common by different pixels. The slit 1141 and the slit 1125 on the pixel electrodes 1124 and 1126 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased.

A first liquid crystal element 1151 is formed by overlapping of the pixel electrode 1124, the liquid crystal layer 1150, and the counter electrode 1140. A second liquid crystal element 1152 is formed by overlapping of the pixel electrode 1126, the liquid crystal layer 1150, and the counter electrode 1140. This is a multi-domain structure in which the first liquid crystal element and the second liquid crystal element are included in one pixel.

Next, a horizontal electric field liquid crystal display device is described. The horizontal electric field mode is a method in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 19:
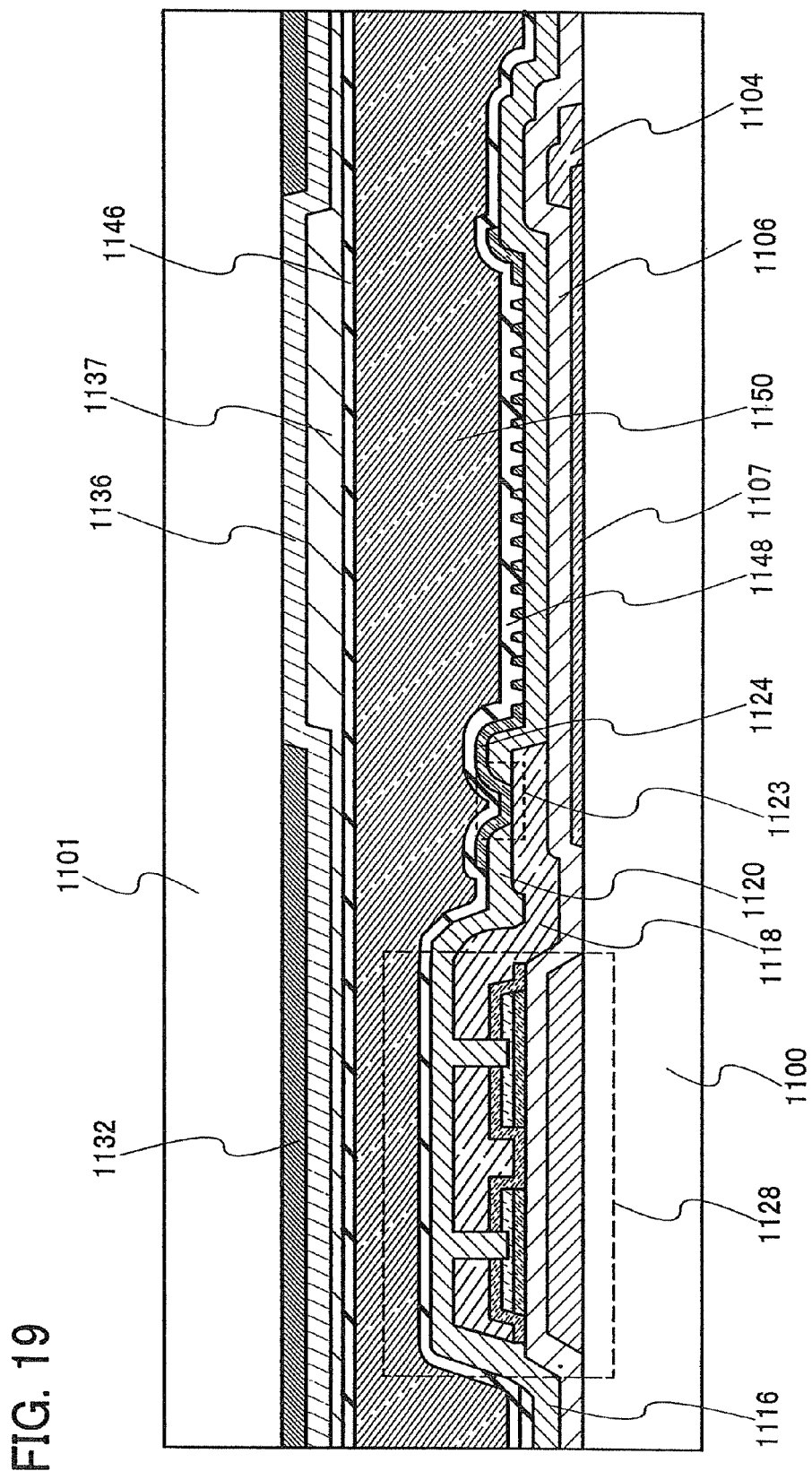
FIG. 19 is a diagram showing a liquid crystal display device of the present invention.

FIG. 19 illustrates a state in which the substrate 1100 provided with the multi-channel TFT 1128 and the pixel electrode 1124 connected to the multi-channel TFT 1128 overlaps with the counter substrate 1101, and liquid crystal is injected therebetween. The counter substrate 1101 is provided with the light shielding film 1132, the second colored film 1136, the planarization film 1137, and the like. Since the pixel electrodes 1124, 1107 are provided over the substrate 1100, they are not provided over the counter substrate 1101. The liquid crystal layer 1150 is formed between the substrate 1100 and the counter substrate 1101.

A first pixel electrode 1107, the capacitor wiring 1104 connected to the first pixel electrode 1107, and the multi-channel TFT 1128 shown in Embodiment Modes 1 to 3 are formed over the substrate 1100. The first pixel electrode 1107 can be formed using a material similar to any of those of the pixel electrodes shown in Embodiment Modes 1 to 3. The first pixel electrode 1107 is formed in a shape which is compartmentalized roughly in accordance with a pixel shape. Note that the gate insulating film 1106 is formed over the first pixel electrode 1107 and the capacitor wiring 1104.

The wirings 1116 and 1118 of the multi-channel TFT 1128 are formed over the gate insulating film 1106. The wiring 1116 serves as a data line extending in one direction, through which a video signal is transmitted in a liquid crystal panel, and is connected to a source region and serves as one of a source electrode and a drain electrode. The wiring 1118 serves as the other of the source electrode and the drain electrode, and is connected to the second pixel electrode 1124.

The insulating film 1120 is formed over the wirings 1116 and 1118. Over the insulating film 1120, the second pixel electrode 1124 connected to the wiring 1118 via a contact hole 1123 formed in the insulating film 1120 is formed. The second pixel electrode 1124 is formed using a material similar to those of the pixel electrodes shown in Embodiment Mode 1 to 3.

In such a manner, the multi-channel TFT 1128 and the second pixel electrode 1124 connected to the multi-channel TFT 1128 are formed over the substrate 1100. Note that a storage capacitor is formed between the first pixel electrode 1107 and the second pixel electrode 1124.

Figure 20:
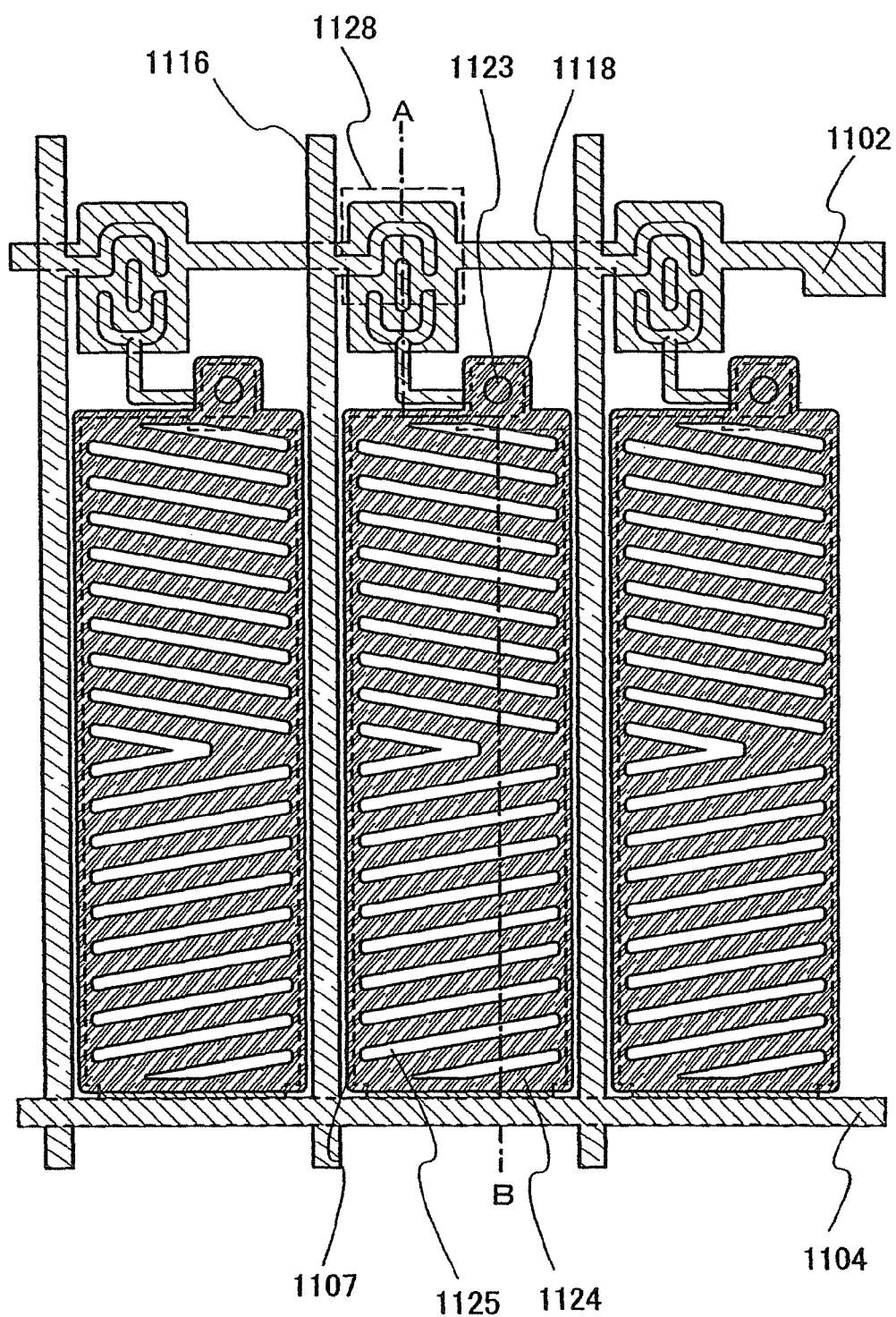
FIG. 20 is a diagram showing a liquid crystal display device of the present invention.

FIG. 20 is a plan view illustrating a structure of the pixel electrodes 1124, 1107. The second pixel electrode 1124 is provided with the slit 1125. The slit 1125 is for controlling alignment of the liquid crystal. In this case, an electric field is generated between the first pixel electrode 1107 and the second pixel electrode 1124. The thickness of the gate insulating film 1106 formed between the first pixel electrode 1107 and the second pixel electrode 1124 is 50 to 200 nm, which is sufficiently thin compared with the liquid crystal layer with a thickness of 2 to 10 μm. Accordingly, an electric field is generated substantially in parallel (in a horizontal direction) to the substrate 1100. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is hardly affected by change in angle of viewing, and a viewing angle is increased. Further, since both the first pixel electrode 1107 and the second pixel electrode 1124 are light-transmitting electrodes, an aperture ratio can be increased.

Next, another example of a horizontal electric field liquid crystal display device is described.

Figure 21:
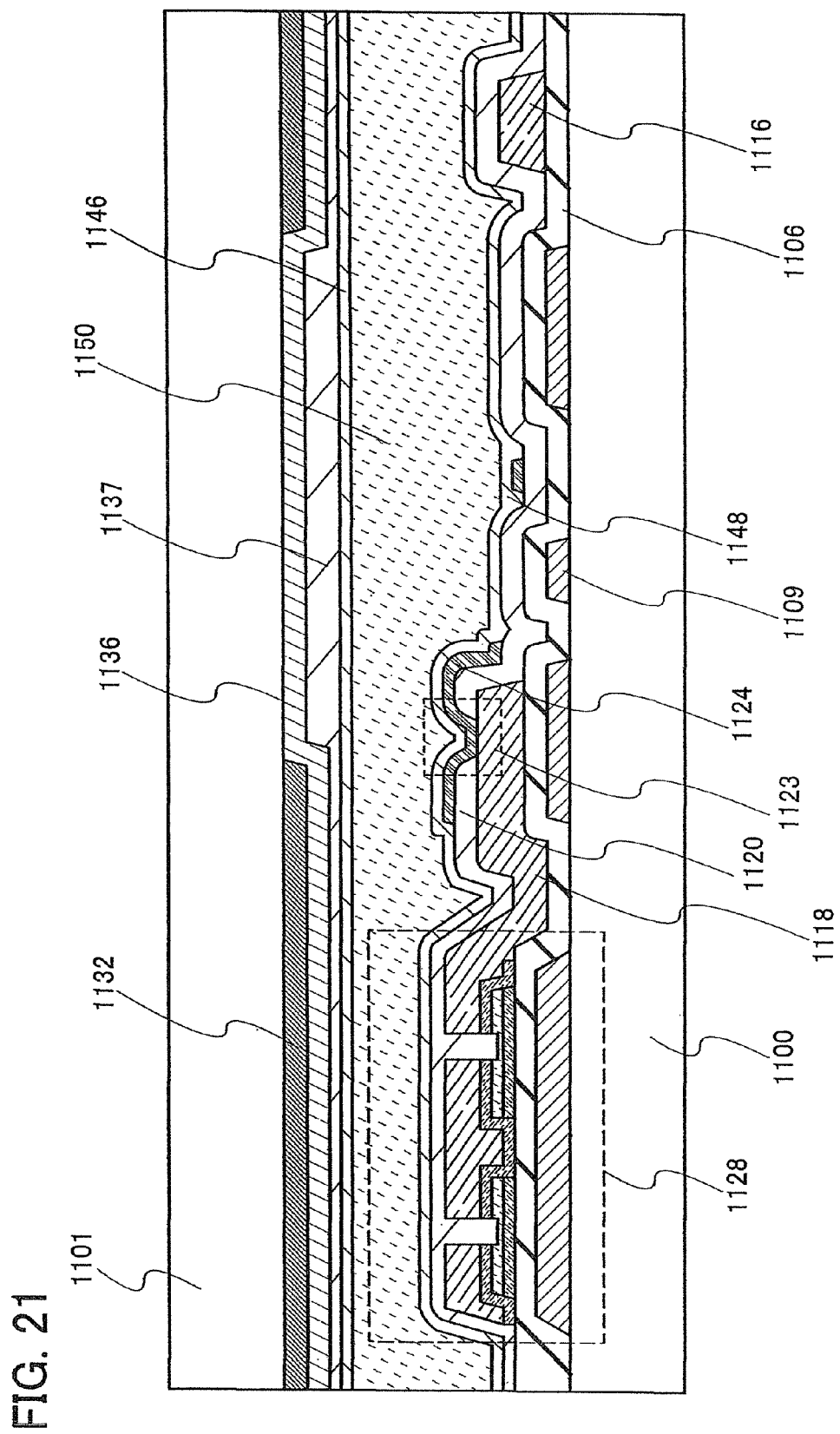
FIG. 21 is a diagram showing a liquid crystal display device of the present invention.
Figure 22:
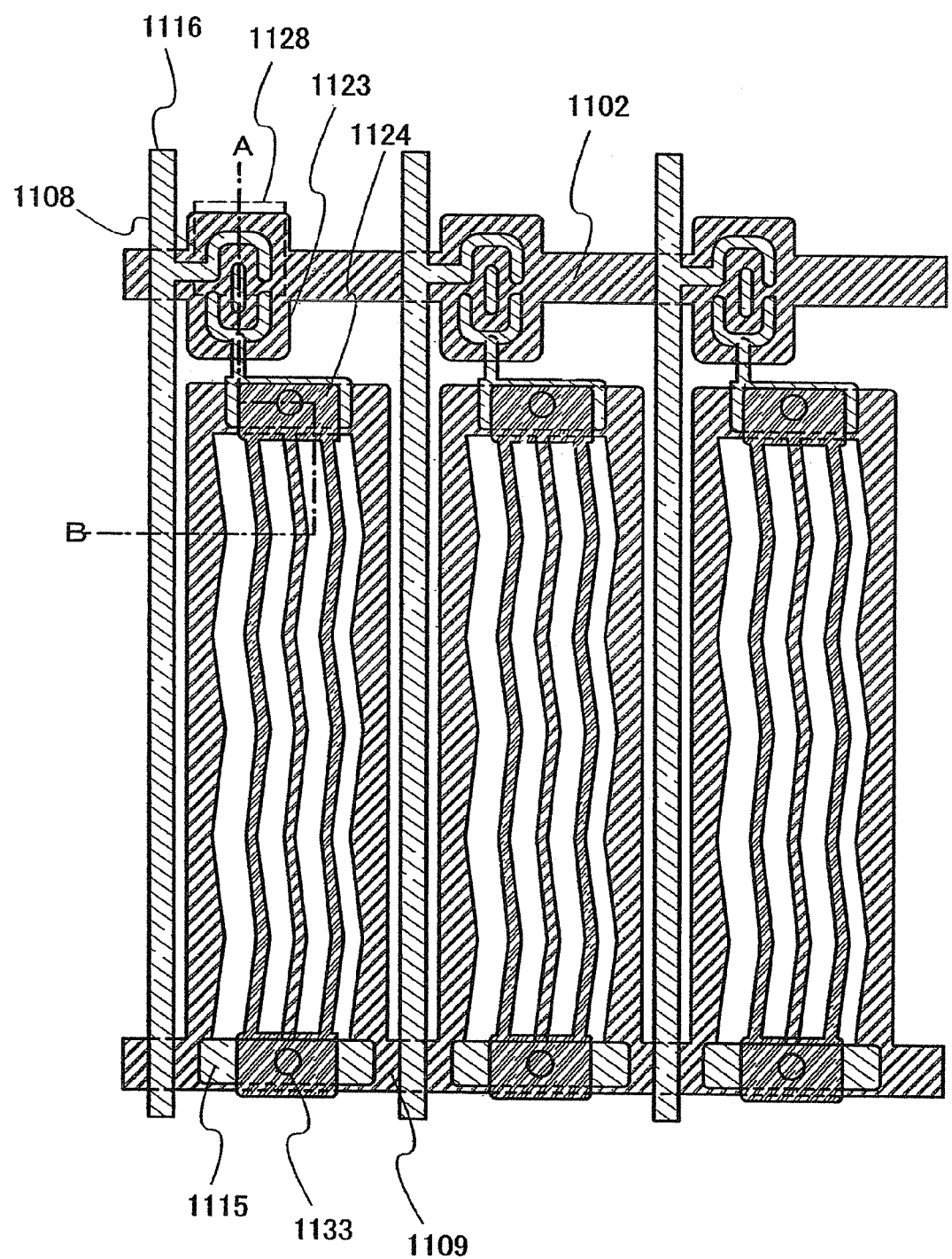
FIG. 22 is a diagram showing a liquid crystal display device of the present invention.

FIGS. 21 and 22 each show a pixel structure of an IPS liquid crystal display device. FIG. 22 is a plan view. FIG. 21 shows a cross-sectional structure of the diagram in FIG. 22 along a line A-B. Hereinafter, description is made with reference to these drawings.

FIG. 21 illustrates a state in which the substrate 1100 provided with the multi-channel TFT 1128 and the pixel electrode 1124 connected to the multi-channel TFT 1128 overlaps with the counter substrate 1101, and liquid crystal is injected therebetween. The counter substrate 1101 is provided with the light shielding film 1132, the colored film 1136, the planarization film 1137, and the like. Since the pixel electrode is provided over the substrate 1100, it is not provided over the counter substrate 1101. The liquid crystal layer 1150 is formed between the substrate 1100 and the counter substrate 1101. Reference numerals 1146, 1148 denote alignment films.

A common potential line 1109 and the multi-channel TFT 1128 shown in Embodiment Modes 1 to 3 are formed over the substrate 1100. The common potential line 1109 can be formed at the same time as the gate wiring 1102 of the multi-channel TFT 1128. The pixel electrode 1124 is formed in a shape which is compartmentalized roughly in accordance with a pixel shape.

The wirings 1116 and 1118 of the multi-channel TFT 1128 are formed over the gate insulating film 1106. The wiring 1116 serves as a data line extending in one direction, through which a video signal is transmitted in a liquid crystal panel, and serves as one of a source electrode and a drain electrode. The wiring 1118 serves as the other of the source electrode and the drain electrode, and is connected to the pixel electrode 1124.

The insulating film 1120 is formed over the wirings 1116 and 1118. Over the insulating film 1120, the pixel electrode 1124 connected to the wiring 1118 via the contact hole 1123 formed in the insulating film 1120 is formed. The pixel electrode 1124 is formed using a material similar to those of the pixel electrodes shown in Embodiment Modes 1 to 3. Note that as illustrated in FIG. 22, the pixel electrode 1124 is formed so as to generate a horizontal electric field with a comb-shaped electrode which is formed at the same time as the common potential line 1109. Moreover, the pixel electrode 1124 is formed so that comb-teeth portions of the pixel electrode 1124 are alternately engaged with the comb-shaped electrode which is formed at the same time as the common potential line 1109. Reference numeral 1108 denotes a signal line.

Alignment of the liquid crystal is controlled by an electric field generated between a potential applied to the pixel electrode 1124 and a potential of the common potential line 1109. The liquid crystal molecules are horizontally rotated using the electric field which is approximately parallel to the substrate. In this case, since the liquid crystal molecules are parallel to the substrate in any state, contrast or the like is hardly affected by change in angle of viewing, and a viewing angle is increased.

In such a manner, the multi-channel TFT 1128 and the pixel electrode 1124 connected to the multi-channel TFT 1128 are formed over the substrate 1100. A storage capacitor is formed by the common potential line 1109, a capacitor electrode 1115, and the gate insulating film 1106 provided therebetween. The capacitor electrode 1115 and the pixel electrode 1124 are connected via a contact hole 1133.

Through the above-described steps, the liquid crystal display device can be formed. Since a thin film transistor with small off current and highly-reliable electric properties is used in the liquid crystal display device of this embodiment mode, the liquid crystal display device has high contrast and high visibility. Further, since a thin film transistor using a microcrystalline silicon film formed without a laser crystallization process is used, a liquid crystal display device with high visibility can be formed with high productivity.

Note that in the liquid crystal display device of the present invention, by using a multi-channel TFT including a microcrystalline semiconductor as a transistor included in a pixel, the pixel can be operated at high speed. For example, when a case of using an amorphous semiconductor film and a case of using a microcrystalline semiconductor film are compared, the mobility of a transistor is larger in the case of using a microcrystalline film; therefore, switching of the transistor can be operated at high speed. Further, increase of frame frequency, insert of a black frame, or the like can also be realized.

In the case of increasing the frame frequency, it is desirable to generate data of a screen depending on a direction of motion of an image. That is, motion compensation is performed to interpolate the data. By increasing the frame frequency and interpolating date in this manner, a display characteristic of a moving image can be improved and a smooth display can be performed. For example, by more than doubling (for example, 120 hertz or 100 hertz), preferably, more than quadrupling (for example, 240 hertz or 200 hertz) the frame frequency, a blurry image or image lag of a moving image can be reduced. In that case, by also operating a scan line driver circuit with increased driving frequency, the frame frequency can be increased.

In the case of performing black frame insertion, it is made so that image data and data that becomes a black display can be supplied to a pixel portion. As a result, it is similar to impulse driving, and image lag can be reduced. In that case, by also operating a scan line driver circuit with increased driving frequency, black frame/screen insertion can be performed.

Embodiment Mode 5

Next, a structure of a display panel, which is one mode of a liquid crystal display device of the present invention, is described below.

Figure 23A:
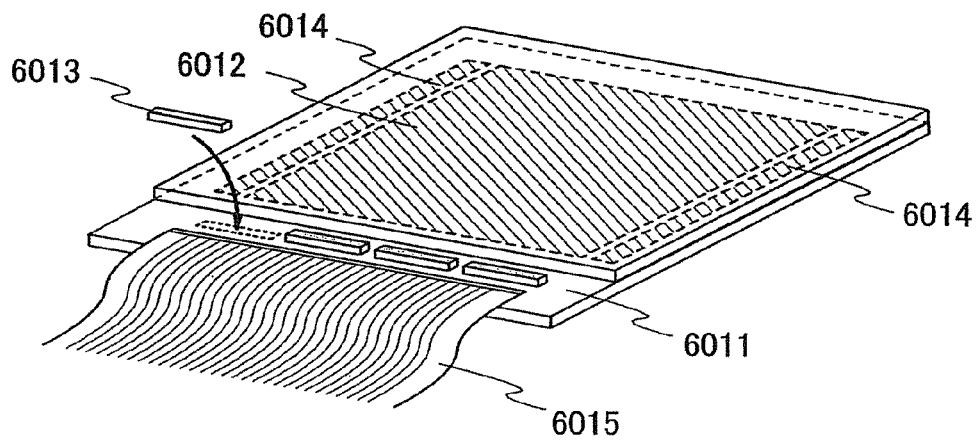
FIGS. 23A to 23C are diagrams showing liquid crystal display devices of the present invention.
Figure 23B:
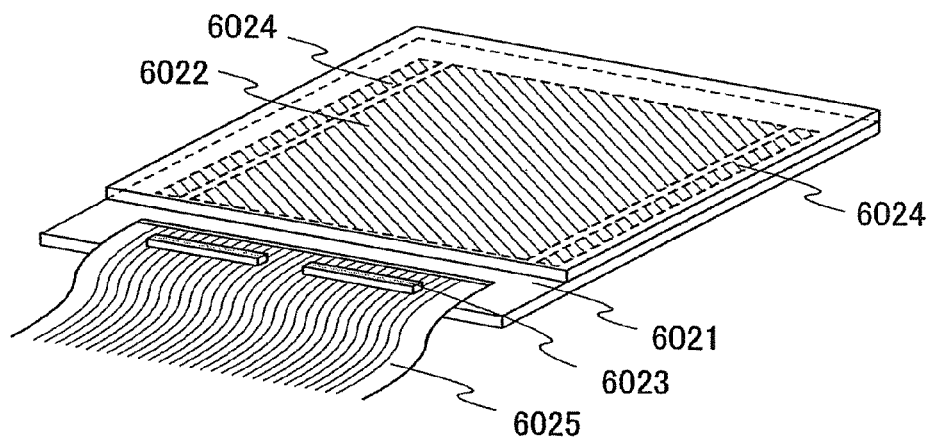
Figure 23C:
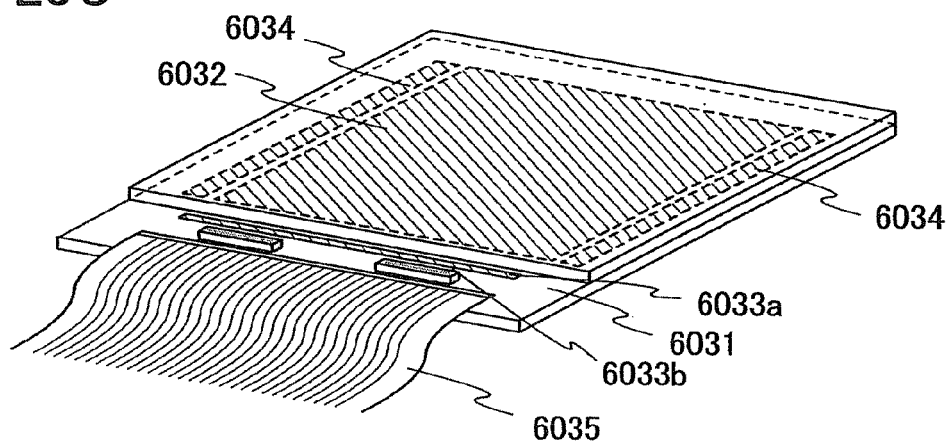

FIGS. 23A to 23C show a mode of a display panel in which a signal line driver circuit 6013 which is separately formed is connected to a pixel portion 6012 formed over a substrate 6011. The pixel portion 6012 and a scan line driver circuit 6014 are each formed using a thin film transistor using a microcrystalline semiconductor film. When the signal line driver circuit is formed using a transistor which has higher field-effect mobility compared with a multi-channel TFT using a microcrystalline semiconductor film, an operation of the signal line driver circuit which demands higher driving frequency than that of the scan line driver circuit can be stabilized. Note that the signal line driver circuit 6013 may be formed using a transistor including a single crystalline semiconductor, a thin film transistor including a polycrystalline semiconductor, or a transistor using an SOI substrate. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

When a driver circuit is separately formed, a substrate over which the driver circuit is formed is not necessarily attached to a substrate over which a pixel portion is formed, and may be attached over an FPC, for example. FIG. 23B shows a mode of a liquid crystal display device panel in which a signal line driver circuit 6023 is separately formed and is connected to a pixel portion 6022 and a scan line driver circuit 6024 formed over a substrate 6021. The pixel portion 6022 and the scan line driver circuit 6024 are each formed using a thin film transistor including a microcrystalline semiconductor film. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Alternatively, only part of a signal line driver circuit or part of a scan line driver circuit may be formed over the same substrate as a pixel portion by using a multi-channel TFT including a microcrystalline semiconductor film, and the rest of the driver circuits may be separately formed and electrically connected to the pixel portion. FIG. 23C shows a mode of a liquid crystal display device panel in which an analog switch 6033*a* included in a signal line driver circuit is formed over a substrate 6031, which is the same substrate over which a pixel portion 6032 and a scan line driver circuit 6034 are formed, and a shift register 6033*b* included in the signal line driver circuit is separately formed over a different substrate and attached to the substrate 6031. The pixel portion 6032 and the scan line driver circuit 6034 are each formed using a multi-channel TFT including a microcrystalline semiconductor film. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 23A to 23C, in a liquid crystal display device of the present invention, all or a part of the driver circuit can be formed over the same substrate as the pixel portion, using a microcrystalline semiconductor film using a multi-channel TFT.

Note that a connection method of a substrate which is separately formed is not particularly limited, and a known COG method, wire bonding method, TAB method, or the like can be used. Further, a connection position is not limited to the positions shown in FIGS. 23A to 23C as long as electrical connection is possible. Moreover, a controller, a CPU, a memory, or the like may be formed separately and connected.

Note that a signal line driver circuit used in the present invention is not limited to a mode including only a shift register and an analog switch. In addition to the shift register and the analog switch, another circuit such as a buffer, a level shifter, or a source follower may be included. Moreover, the shift register and the analog switch are not always necessary to be provided. For example, a different circuit such as a decoder circuit by which a signal line can be selected may be used instead of the shift register, or a latch or the like may be used instead of the analog switch.

Figure 24:
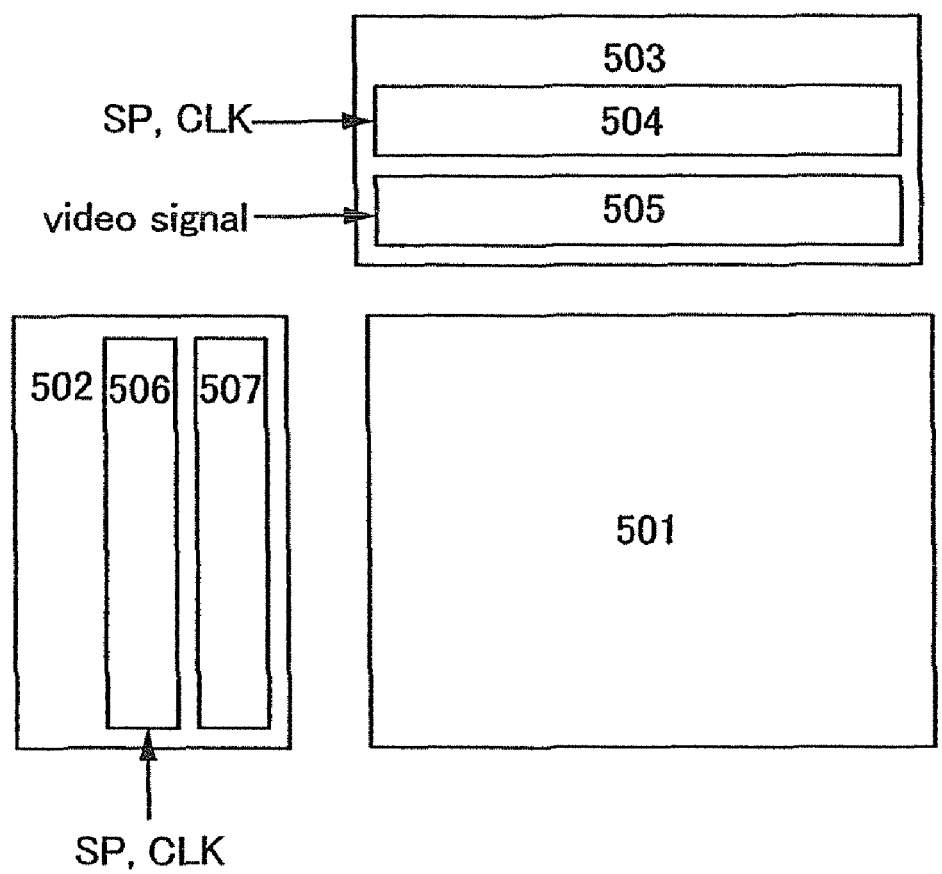
FIG. 24 is a diagram showing a liquid crystal display device of the present invention.

FIG. 24 is a block diagram of a liquid crystal display device of the present invention. The liquid crystal display device shown in FIG. 24 includes a pixel portion 501 including a plurality of pixels each provided with a liquid crystal element, a scan line driver circuit 502 which selects each pixel, and a signal line driver circuit 503 which controls input of a video signal to a selected pixel.

In FIG. 24, the signal line driver circuit 503 includes a shift register 504 and an analog switch 505. A clock signal (CLK) and a start pulse signal (SP) are input to the shift register 504. When the clock signal (CLK) and the start pulse signal (SP) are input, a timing signal is generated in the shift register 504 and input to the analog switch 505.

A video signal is supplied to the analog switch 505. The analog switch 505 samples the video signal in accordance with the timing signal and supplies the resulting signal to a signal line of the next stage.

Next, a structure of the scan line driver circuit 502 is described. The scan line driver circuit 502 includes a shift register 506 and a buffer 507. The scan line driver circuit 502 may also include a level shifter in some cases. In the scan line driver circuit 502, when the clock signal (CLK) and the start pulse signal (SP) are input to the shift register 506, a selection signal is generated. The generated selection signal is buffered and amplified by the buffer 507, and the resulting signal is supplied to a corresponding scan line. Gates of transistors in pixels of one line are connected to the scan line. Further, since the transistors in the pixels of one line should be turned on at the same time, a buffer through which large current can flow is used as the buffer 507.

In a full color liquid crystal display device, when video signals corresponding to R (red), G (green), or B (blue) are sequentially sampled and supplied to a corresponding signal line, the number of terminals for connecting the shift register 504 and the analog switch 505 corresponds to approximately ⅓ of the number of terminals for connecting the analog switch 505 and the signal line in the pixel portion 501. Accordingly, when the analog switch 505 and the pixel portion 501 are formed over the same substrate, the number of terminals used for connecting substrates which are separately formed can be suppressed compared with the case where the analog switch 505 and the pixel portion 501 are formed over different substrates; thus, occurrence probability of defective connection can be suppressed, and yield can be increased.

Note that although the scan line driver circuit 502 shown in FIG. 24 includes the shift register 506 and the buffer 507, the scan line driver circuit 502 may include the shift register 506.

Note that structures of the signal line driver circuit and the scan line driver circuit are not limited to the structures shown in FIG. 24, which are merely one mode of the liquid crystal display device of the present invention.

This embodiment mode can be implemented in combination with any of the structures described in the other embodiment modes.

Embodiment Mode 6

The liquid crystal display device obtained according to the present invention can be used for an active matrix liquid crystal module. That is, the present invention can be implemented in any of electronic devices having a display portion in which such an active matrix liquid crystal module is incorporated.

Figure 25A:
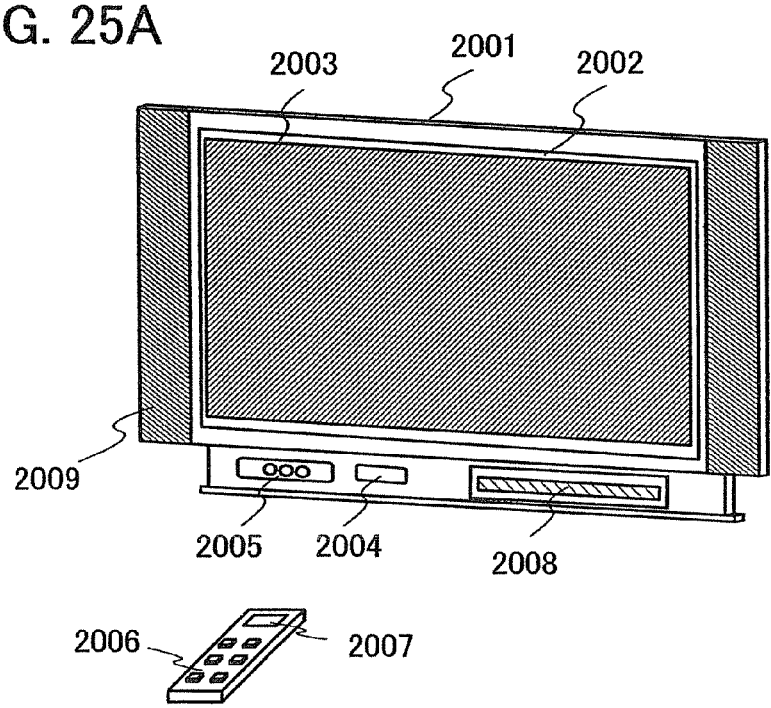
FIGS. 25A to 25C are diagrams each showing a liquid crystal display device of the present invention.
Figure 25B:
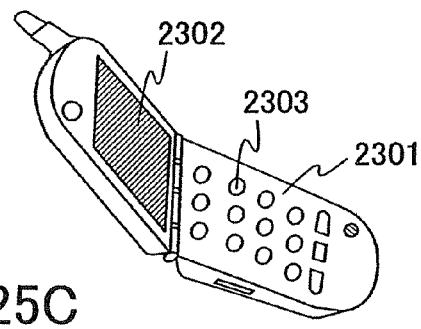
Figure 25C:
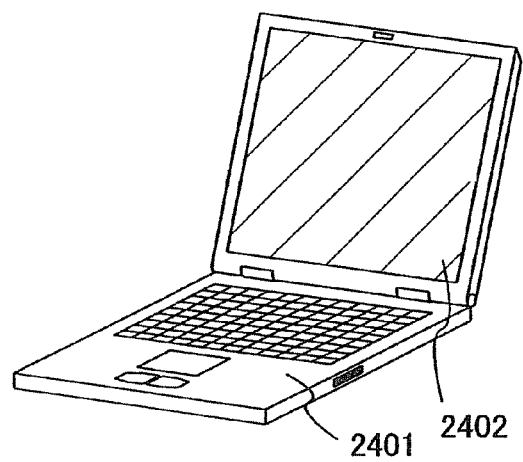

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). FIGS. 25A to 25C show examples of such electronic devices.

FIG. 25A shows a television device. The television device can be completed by incorporating a display module into a housing as shown in FIG. 25A. A display panel with an FPC attached is also referred to as a display module. A main screen 2003 is formed using the display module, and other accessories such as a speaker portion 2009 and an operation switch are provided. Thus, the television device can be completed.

As shown in FIG. 25A, a display panel 2002 using a liquid crystal element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel with an excellent viewing angle, and the sub screen may be formed using a liquid crystal display panel in which display is performed with low power consumption. Alternatively, when reduction in power consumption is prioritized, a structure may be employed in which the main screen 2003 is formed using a liquid crystal display panel, the sub screen is formed using a liquid crystal display panel, and the sub screen can be turned on and off.

Figure 26:
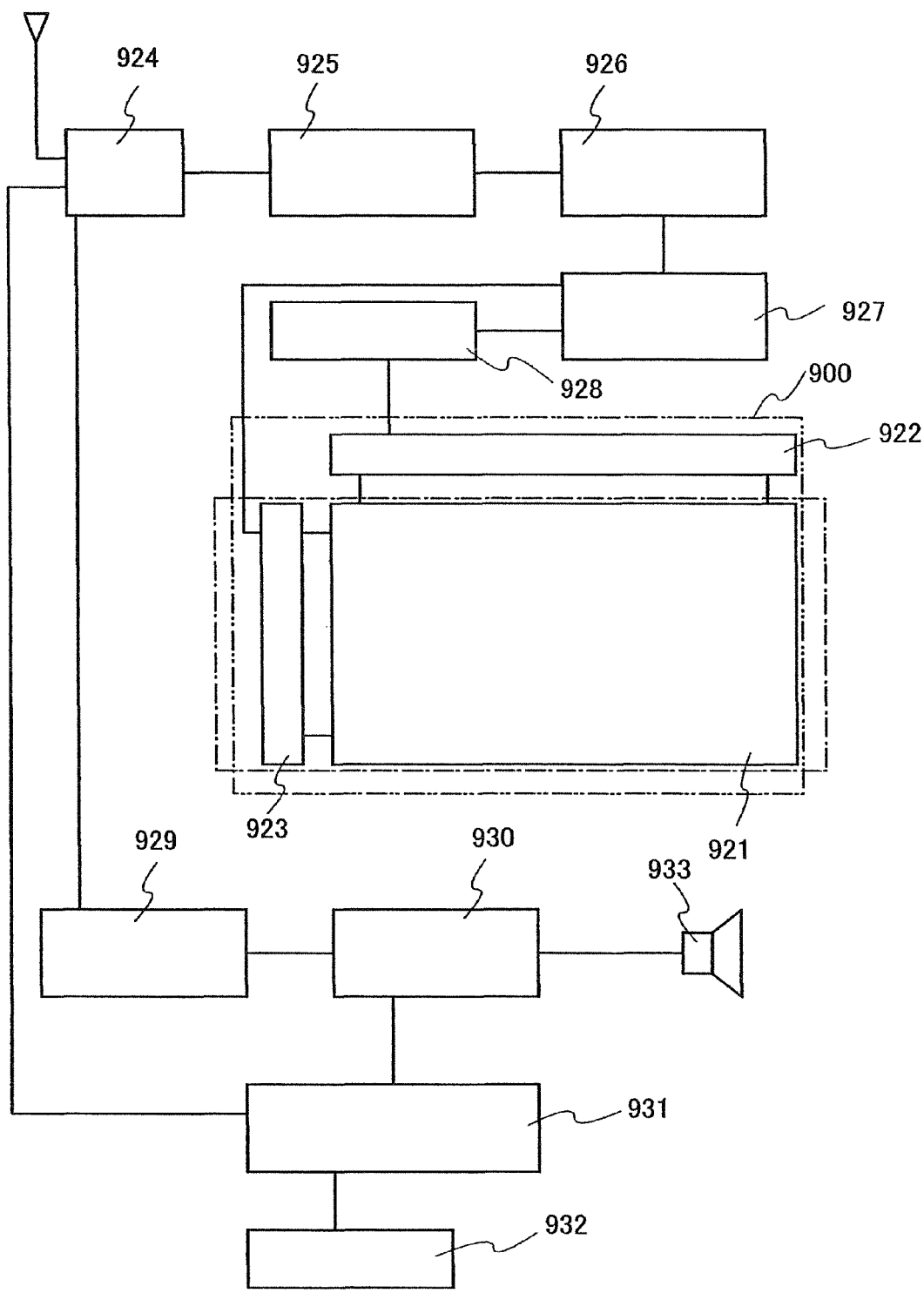
FIG. 26 is a diagram showing a liquid crystal display device of the present invention.

FIG. 26 is a block diagram of a main structure of a television device. A display panel 900 is provided with a pixel portion 921. A signal line driver circuit 922 and a scan line driver circuit 923 may be mounted on the display panel 900 by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to a variety of uses, such as a monitor of a personal computer, a large display medium such as an information display board at the train station, the airport, or the like, or an advertisement display board on the street.

FIG. 25B shows an example of a cellular phone 2301. The cellular phone 2301 includes a display portion 2302, an operation portion 2303, and the like. When the liquid crystal display device described in the above-described embodiment mode is used for the display portion 2302, mass productivity can be increased.

A portable computer shown in FIG. 25C includes a main body 2401, a display portion 2402, and the like. When the liquid crystal display device described in the above-described embodiment mode is used for the display portion 2402, mass productivity can be increased.

Embodiment 1

Figure 27A:
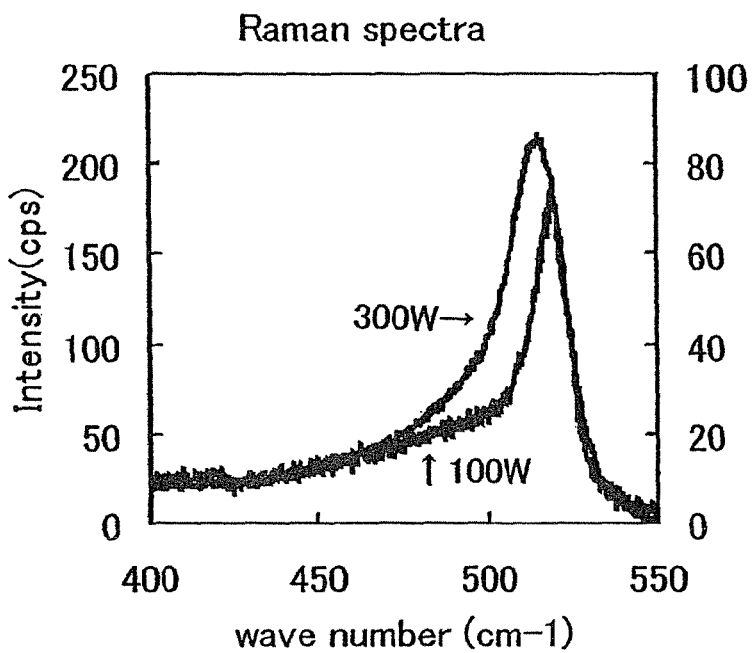
FIGS. 27A and 27B are graphs each showing a result of measuring a microcrystalline semiconductor film by Raman spectroscopy.
Figure 27B:
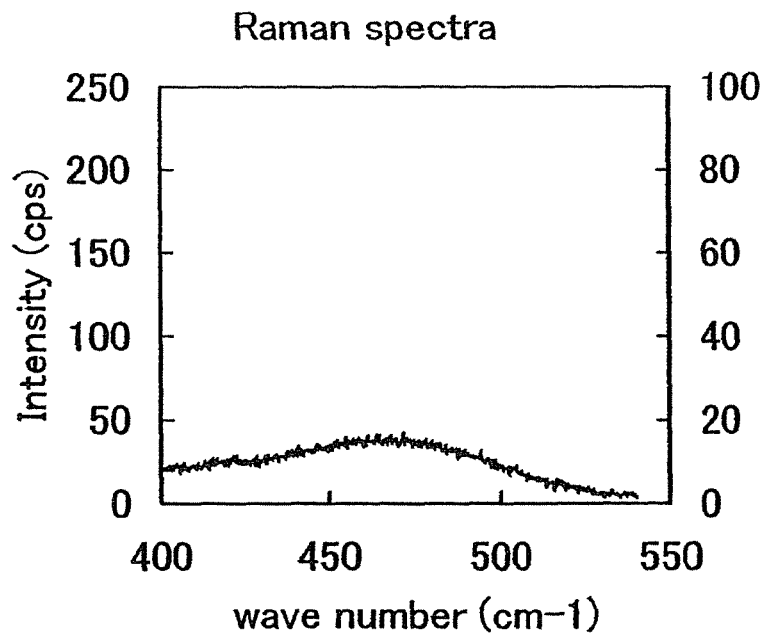

A microcrystalline silicon film was formed, and results of measuring the crystallinity of the film by Raman spectroscopy are shown in FIGS. 27A and 27B.

The microcrystalline silicon film was formed under conditions where the RF power frequency was 13.56 MHz, the film formation temperature was 280° C., the flow rate ratio of hydrogen to a silane gas was 100:1, and the pressure was 280 Pa. FIG. 27A shows Raman scattering spectra and shows a comparison of measurement results of a microcrystalline silicon film that was formed with the amount of power of an RF power source being 100 W and a microcrystalline silicon film with 300 W.

Note that the crystalline peak position of single crystalline silicon is at 521 cm$^{-1}$. Needless to say, the crystalline peak of amorphous silicon cannot be observed, and only a broad peak is measured at 480 cm$^{-1}$ as illustrated in FIG. 27B. The microcrystalline silicon film of this specification refers to one whose crystalline peak position can be observed at greater than or equal to 481 cm$^{-1}$ and less than 520 cm$^{-1}$ when measured with a Raman spectrometer.

The crystalline peak position of the microcrystalline silicon film which was formed with the amount of power of an RF power source being 100 W is at 518.6 cm$^{-1}$; the full width at half maximum (FWHM) is 11.9 cm$^{-1}$; and the crystalline/amorphous peak intensity ratio ($I_c/I_a$) is 4.1.

The crystalline peak position of the microcrystalline silicon film that was formed with the amount of power of an RF power source being 300 W is at 514.8 cm$^{-1}$; the full width at half maximum (FWHM) is 18.7 cm$^{-1}$; and the crystalline/amorphous peak intensity ratio ($I_c/I_a$) is 4.4.

As illustrated in FIG. 27A, there is a peak shift and a large difference in full width at half maximum depending on RF power. It can be considered that this is because the grain size is likely to be small, because ion bombardment becomes significant at high power and the growth of grains is inhibited. In addition, because the power frequency of a CVD apparatus, with which the microcrystalline silicon film used for measurement of FIG. 27A was formed, is 13.56 MHz, the crystalline/amorphous peak intensity ratio ($I_c/I_a$) is 4.1 or 4.4. However, it is also confirmed that the crystalline/amorphous peak intensity ratio ($I_c/I_a$) can be 6 if the RF power frequency is 27 MHz. Accordingly, the crystalline/amorphous peak intensity ratio ($I_c/I_a$) can be further increased when the RF power frequency is higher than 27 MHz, for example, when the RF power frequency is 2.45 GHz.

This application is based on Japanese Patent Application serial no. 2007-194844 filed with Japan Patent Office on Jul. 26 in 2007, the entire contents of which are hereby incorporated by reference.

What is claimed is:

1. A display device comprising:
   an electrode over a substrate;
   an insulating film over the electrode;
   a first semiconductor film over the insulating film, the first semiconductor film overlapping the electrode;
   a second semiconductor film over the insulating film, the second semiconductor film overlapping the electrode;
   a first conductive film over the first semiconductor film;
   a second conductive film over the second semiconductor film; and
   a third conductive film over the first semiconductor film and the second semiconductor film, the third conductive film being electrically connected to the first semiconductor film and the second semiconductor film.

2. The display device according to claim 1, wherein the electrode is a gate electrode of a transistor.

3. The display device according to claim 1, wherein each of the first semiconductor film and the second semiconductor film is a microcrystalline semiconductor film.

4. The display device according to claim 3, wherein the microcrystalline semiconductor film is a microcrystalline silicon film.

5. The display device according to claim 1, wherein each of the first conductive film, the second conductive film and the third conductive film comprises titanium.

6. The display device according to claim 1, wherein the display device is a liquid crystal display device.

7. The display device according to claim 1, wherein the display device is incorporated into an electronic device selected from the group consisting of a video camera, a digital camera, a head-mounted display, a car navigation system, a projector, a car stereo, a personal computer, a mobile computer, a cellular phone, and an e-book reader.

8. A display device comprising:
   an electrode over a substrate;
   an insulating film over the electrode;
   a first semiconductor film over the insulating film, the first semiconductor film overlapping the electrode;
   a second semiconductor film over the insulating film, the second semiconductor film overlapping the electrode;

a first conductive semiconductor film over the first semiconductor film;
a second conductive semiconductor film over the second semiconductor film;
a third conductive semiconductor film over the first semiconductor film and the second semiconductor film, the third conductive semiconductor film being in contact with the insulating film between the first semiconductor film and the second semiconductor film;
a first conductive film over the first conductive semiconductor film;
a second conductive film over the second conductive semiconductor film; and
a third conductive film over the third conductive semiconductor film.

9. The display device according to claim 8, wherein the electrode is a gate electrode of a transistor.

10. The display device according to claim 8, wherein each of the first semiconductor film and the second semiconductor film is a microcrystalline semiconductor film.

11. The display device according to claim 10, wherein the microcrystalline semiconductor film is a microcrystalline silicon film.

12. The display device according to claim 8, wherein each of the first conductive semiconductor film, the second conductive semiconductor film and the third conductive semiconductor film includes an impurity element.

13. The display device according to claim 8, wherein each of the first conductive film, the second conductive film and the third conductive film comprises titanium.

14. The display device according to claim 8, wherein the display device is a liquid crystal display device.

15. The display device according to claim 8, wherein the display device is incorporated into an electronic device selected from the group consisting of a video camera, a digital camera, a head-mounted display, a car navigation system, a projector, a car stereo, a personal computer, a mobile computer, a cellular phone, and an e-book reader.

16. A display device comprising:
an electrode over a substrate;
an insulating film over the electrode;
a first semiconductor film over the insulating film, the first semiconductor film overlapping the electrode;
a second semiconductor film over the insulating film, the second semiconductor film overlapping the electrode;
a third semiconductor film over the first semiconductor film;
a fourth semiconductor film over the second semiconductor film;
a fifth semiconductor film over the third semiconductor film;
a sixth semiconductor film over the fourth semiconductor film;
a seventh semiconductor film over the third semiconductor film and the fourth semiconductor film, the seventh semiconductor film being in contact with the insulating film between the third semiconductor film and the fourth semiconductor film;
a first conductive film over the fifth semiconductor film;
a second conductive film over the sixth semiconductor film; and
a third conductive film over the seventh semiconductor film.

17. The display device according to claim 16, wherein the electrode is a gate electrode of a transistor.

18. The display device according to claim 16, wherein each of the first semiconductor film and the second semiconductor film is a microcrystalline semiconductor film.

19. The display device according to claim 18, wherein the microcrystalline semiconductor film is a microcrystalline silicon film.

20. The display device according to claim 16, wherein each of the third semiconductor film and the fourth semiconductor film is an amorphous semiconductor film.

21. The display device according to claim 20, wherein the amorphous semiconductor film is an amorphous silicon film.

22. The display device according to claim 16, wherein each of the fifth semiconductor film, the sixth semiconductor film and the seventh semiconductor film includes an impurity element.

23. The display device according to claim 16, wherein each of the first conductive film, the second conductive film and the third conductive film comprises titanium.

24. The display device according to claim 16, wherein the display device is a liquid crystal display device.

25. The display device according to claim 16, wherein the display device is incorporated into an electronic device selected from the group consisting of a video camera, a digital camera, a head-mounted display, a car navigation system, a projector, a car stereo, a personal computer, a mobile computer, a cellular phone, and an e-book reader.

26. A display device comprising:
an electrode over a substrate;
a first insulating film over the electrode;
a first semiconductor film over the first insulating film, the first semiconductor film overlapping the electrode;
a second semiconductor film over the first insulating film, the second semiconductor film overlapping the electrode;
a third semiconductor film over the first semiconductor film;
a fourth semiconductor film over the second semiconductor film;
a fifth semiconductor film over the third semiconductor film;
a sixth semiconductor film over the fourth semiconductor film;
a seventh semiconductor film over the third semiconductor film and the fourth semiconductor film, the seventh semiconductor film being in contact with the first insulating film between the third semiconductor film and the fourth semiconductor film;
a first conductive film over the fifth semiconductor film;
a second conductive film over the sixth semiconductor film;
a third conductive film over the seventh semiconductor film; and
a second insulating film over the first conductive film, the second conductive film and the third conductive film, the second insulating film being in contact with the third semiconductor film and the fourth semiconductor film.

27. The display device according to claim 26, wherein the electrode is a gate electrode of a transistor.

28. The display device according to claim 26, wherein each of the first semiconductor film and the second semiconductor film is a microcrystalline semiconductor film.

29. The display device according to claim 28, wherein the microcrystalline semiconductor film is a microcrystalline silicon film.

30. The display device according to claim 26, wherein each of the third semiconductor film and the fourth semiconductor film is an amorphous semiconductor film.

31. The display device according to claim 30, wherein the amorphous semiconductor film is an amorphous silicon film.

32. The display device according to claim 26, wherein each of the fifth semiconductor film, the sixth semiconductor film and the seventh semiconductor film includes an impurity element.

33. The display device according to claim 26, wherein each of the first conductive film, the second conductive film and the third conductive film comprises titanium.

34. The display device according to claim 26, wherein the display device is a liquid crystal display device.

35. The display device according to claim 26, wherein the display device is incorporated into an electronic device selected from the group consisting of a video camera, a digital camera, a head-mounted display, a car navigation system, a projector, a car stereo, a personal computer, a mobile computer, a cellular phone, and an e-book reader.

* * * * *